(12) United States Patent
Toyoda et al.

(10) Patent No.: US 7,675,183 B2
(45) Date of Patent: Mar. 9, 2010

(54) SEMICONDUCTOR DEVICE INCLUDING AN INSULATING FILM AND INSULATING PILLARS AND MANUFACTURING METHOD OF THE SEMICONDUCTOR DEVICE

(75) Inventors: Hiroshi Toyoda, Yokohama (JP); Mitsuhiro Nakao, Yokohama (JP); Masahiko Hasunuma, Yokohama (JP); Hisashi Kaneko, Fujisawa (JP); Atsuko Sakata, Yokohama (JP); Toshiaki Komukai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 3 days.

(21) Appl. No.: 12/081,818

(22) Filed: Apr. 22, 2008

(65) Prior Publication Data
US 2008/0237863 A1 Oct. 2, 2008

Related U.S. Application Data

(60) Continuation of application No. 11/329,081, filed on Jan. 11, 2006, now abandoned, which is a division of application No. 10/776,202, filed on Feb. 12, 2004, now abandoned, which is a division of application No. 10/084,065, filed on Feb. 28, 2002, now Pat. No. 6,727,593.

(30) Foreign Application Priority Data

| | | |
|---|---|---|
| Mar. 1, 2001 | (JP) | P2001-057367 |
| Aug. 30, 2001 | (JP) | P2001-260644 |
| Dec. 12, 2001 | (JP) | P2001-378778 |
| Dec. 28, 2001 | (JP) | P2001-401293 |

(51) Int. Cl.
*H01L 23/48* (2006.01)
*H01L 23/52* (2006.01)

(52) U.S. Cl. .................. 257/784; 257/786
(58) Field of Classification Search ............ 257/784, 257/786, E21.589, E23.02
See application file for complete search history.

(56) References Cited

U.S. PATENT DOCUMENTS

| 5,635,763 | A | 6/1997 | Inoue et al. |
| 5,785,236 | A | 7/1998 | Cheung et al. |
| 5,942,799 | A | 8/1999 | Danek et al. |
| 6,093,966 | A | 7/2000 | Venkatraman et al. |
| 6,218,302 | B1 | 4/2001 | Braeckelmann et al. |
| 6,306,750 | B1 * | 10/2001 | Huang et al. ............ 438/612 |
| 6,803,302 | B2 * | 10/2004 | Pozder et al. ........... 438/612 |

FOREIGN PATENT DOCUMENTS

| CN | 1156903 C | 7/2004 |
| JP | 9-092649 | 4/1997 |
| JP | 11-074224 | 3/1999 |
| JP | 11-135506 | 5/1999 |
| JP | 2000-049229 | 2/2000 |
| JP | 2001-156070 | 6/2001 |

* cited by examiner

*Primary Examiner*—Hung Vu
(74) *Attorney, Agent, or Firm*—Finnegan, Henderson, Farabow, Garrett & Dunner, L.L.P.

(57) ABSTRACT

A semiconductor device, which is comprised of a copper wiring layer which is formed above a semiconductor substrate, a pad electrode layer which conducts electrically to the copper wiring layer and has an alloy, which contains copper and a metal whose oxidation tendency is higher than copper, formed to extend to the bottom surface, and an insulating protective film which has an opening extended to the pad electrode layer, is provided.

11 Claims, 22 Drawing Sheets

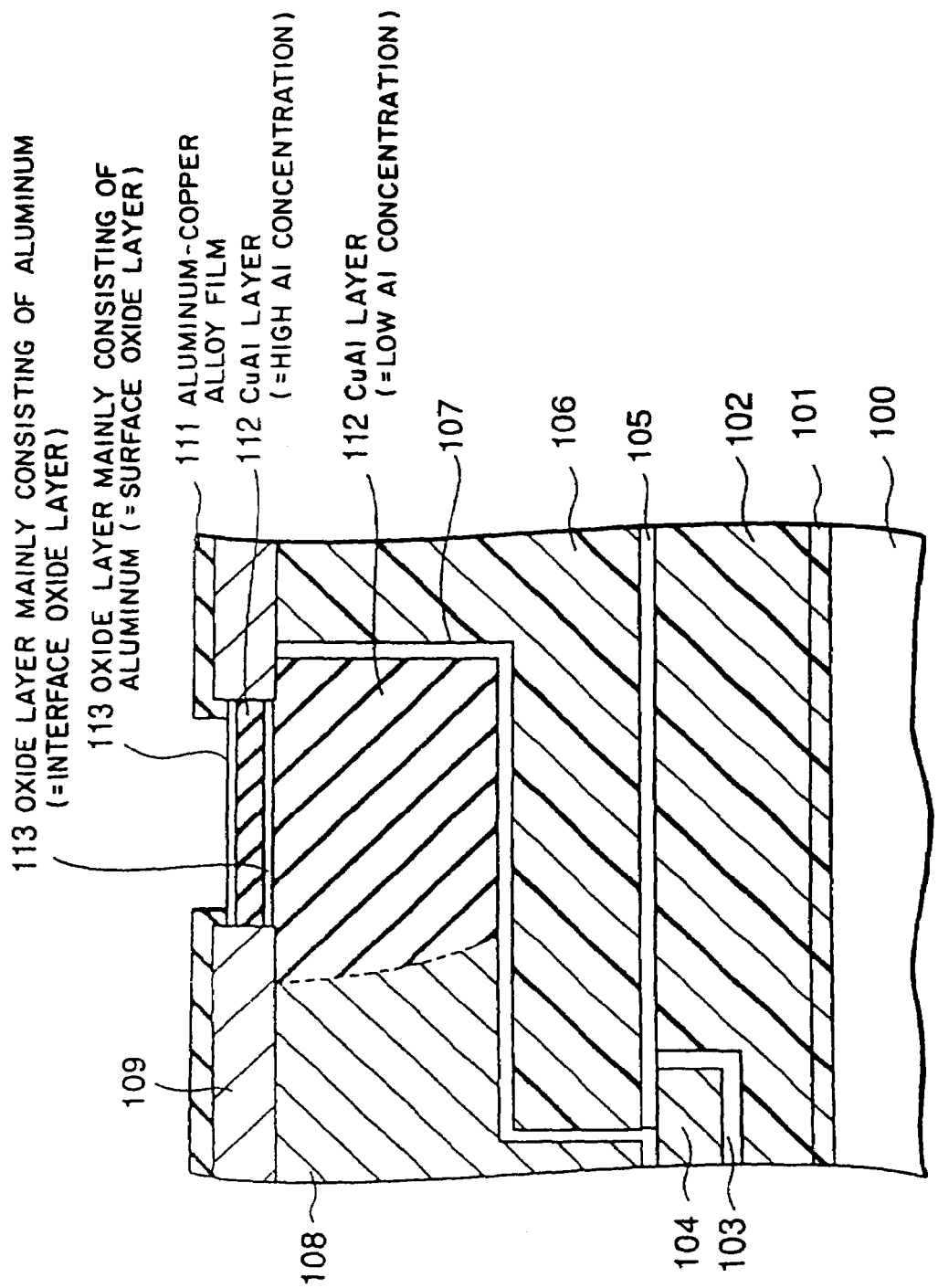

FIG. 3

AL CONCENTRATION IN SURFACE LAYER OF CuAl LAYER AND BONDING PROPERTIES

| Al CONCENTRATION IN SURFACE LAYER | 0.5% | 1% | 1.5% | 2% | 2.5% | 3% | 4% |
|---|---|---|---|---|---|---|---|
| BONDING PROPERTIES | × | × | △ | ○ | ○ | ○ | ○ |

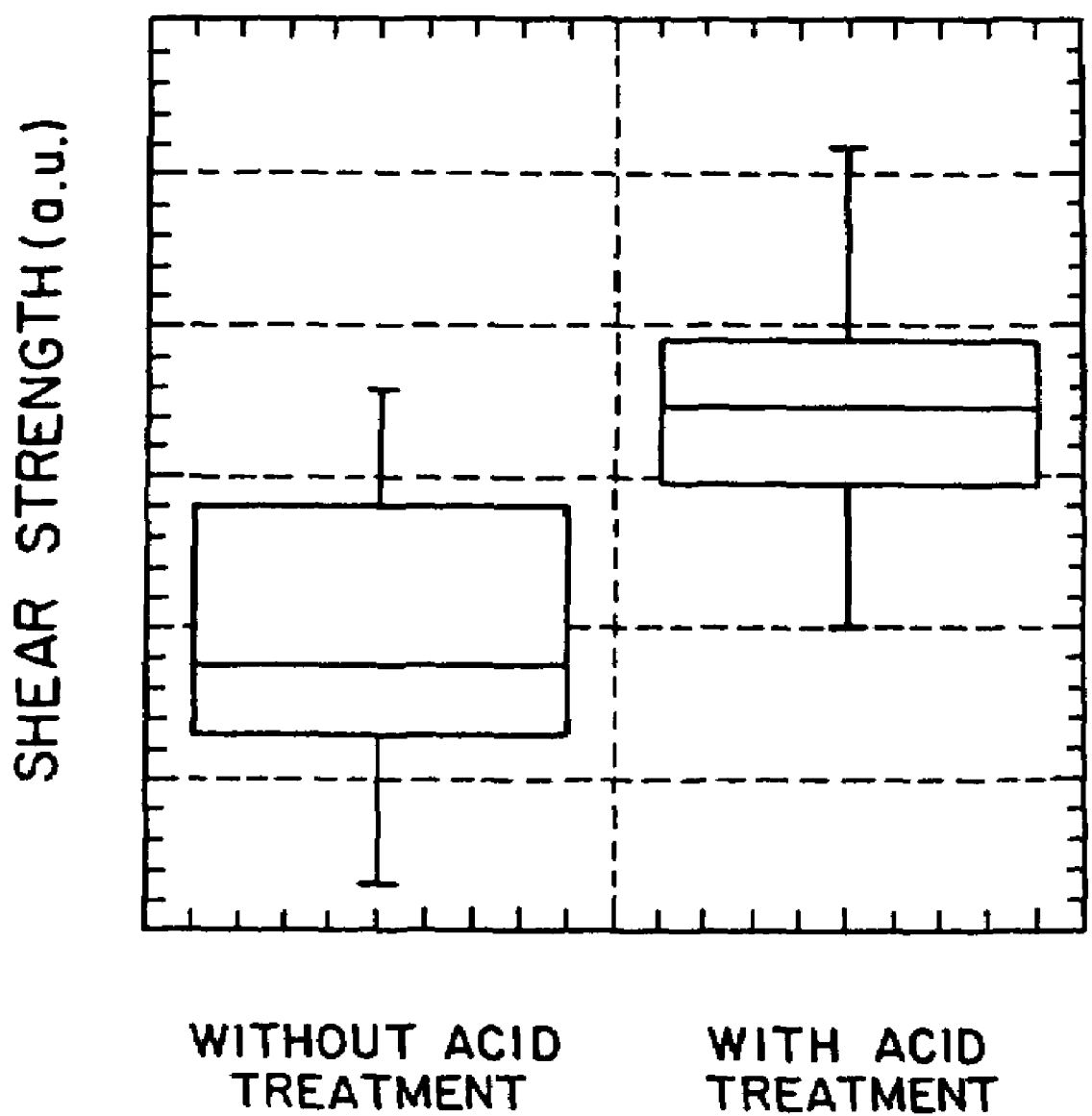

WITHOUT ACID TREATMENT

WITH ACID TREATMENT

FIG. 20

| Ta$_2$N FILM THICKNESS(nm) | 60 | 3 | 5 | 10 | 30 | 60 |
|---|---|---|---|---|---|---|
| Ta FILM THICKNESS(nm) | 10 | 3 | 5 | 10 | 30 | 60 |
| LAMINATION CYCLE(TIMES) | 1 | 1 | 1 | 1 | 1 | 1 |
| Cu/Al BARRIER PROPERTIES | ○ | × | × | × | × | ○ |
| POST-BONDING BARRIER PROPERTIES | × | × | × | × | × | × |
| POST-BONDING ADHESION PROPERTIES | × | ○ | ○ | ○ | × | × |
| DUST | ○ | ○ | ○ | ○ | ○ | ○ |

FIG. 21

| | | | | | | |
|---|---|---|---|---|---|---|
| Ta$_2$N FILM THICKNESS(nm) | 3 | 5 | 10 | 30 | 60 |
| Ta FILM THICKNESS(nm) | 3 | 5 | 10 | 30 | 60 |
| LAMINATION CYCLE(TIMES) | 2 | 2 | 2 | 2 | 2 |
| Cu/Al BARRIER PROPERTIES | × | ○ | ○ | ○ | ○ |
| POST-BONDING BARRIER PROPERTIES | × | ○ | ○ | ○ | ○ |
| POST-BONDING ADHESION PROPERTIES | × | ○ | ○ | ○ | ○ |
| DUST | ○ | ○ | ○ | ○ | × |

FIG. 22

| | | | | | | |
|---|---|---|---|---|---|---|
| Ta$_2$N FILM THICKNESS(nm) | 3 | 5 | 10 | 30 | 60 |
| Ta FILM THICKNESS(nm) | 3 | 5 | 10 | 30 | 60 |
| LAMINATION CYCLE(TIMES) | 3 | 3 | 3 | 3 | 3 |
| Cu/Al BARRIER PROPERTIES | × | ○ | ○ | ○ | ○ |
| POST-BONDING BARRIER PROPERTIES | × | ○ | ○ | ○ | ○ |
| POST-BONDING ADHESION PROPERTIES | × | ○ | ○ | ○ | ○ |
| DUST | ○ | ○ | ○ | ○ | × |

FIG. 23

| | | | | | |
|---|---|---|---|---|---|
| Ta$_2$N FILM THICKNESS(nm) | 3 | 5 | 10 | 30 | 60 |
| Ta FILM THICKNESS(nm) | 3 | 5 | 10 | 30 | 60 |
| LAMINATION CYCLE(TIMES) | 6 | 6 | 6 | 6 | 6 |
| Cu/Al BARRIER PROPERTIES | × | ○ | ○ | ○ | ○ |
| POST-BONDING BARRIER PROPERTIES | × | ○ | ○ | ○ | ○ |
| POST-BONDING ADHESION PROPERTIES | × | ○ | ○ | ○ | × |
| DUST | ○ | ○ | ○ | ○ | × |

FIG. 24

| Ta$_2$N FILM THICKNESS(nm) | 3 | 5 | 10 | 30 | 60 |
|---|---|---|---|---|---|
| Ta FILM THICKNESS(nm) | 3 | 5 | 10 | 30 | 60 |
| LAMINATION CYCLE(TIMES) | 7 | 7 | 7 | 7 | 7 |
| Cu/Al BARRIER PROPERTIES | × | ○ | ○ | ○ | ○ |
| POST-BONDING BARRIER PROPERTIES | × | ○ | ○ | ○ | ○ |
| POST-BONDING ADHESION PROPERTIES | × | ○ | ○ | × | × |
| DUST | ○ | ○ | ○ | × | × |

SEMICONDUCTOR DEVICE INCLUDING AN INSULATING FILM AND INSULATING PILLARS AND MANUFACTURING METHOD OF THE SEMICONDUCTOR DEVICE

CROSS REFERENCE TO RELATED APPLICATIONS

This is a continuation of application Ser. No. 11/329,081, filed Jan. 11, 2006 now abandoned, which is a divisional of application Ser. No. 10/776,202, filed Feb. 12, 2004 (abandoned), which is a divisional of application Ser. No. 10/084,065, filed Feb. 28, 2002 (now U.S. Pat. No. 6,727,593), and claims the benefit of Japanese Application Nos. P2001-057367, filed Mar. 1, 2001, P2001-260644, filed Aug. 30, 2001, P2001-401293, filed Dec. 28, 2001, and P2001-378778, filed Dec. 12, 2001, all of which are incorporated herein by reference.

BACKGROUND OF THE INVENTION

1. Field of the Invention

The present invention relates to a semiconductor device and its manufacturing method, and more particularly to a semiconductor device with the reliability of connection by bonding or the like improved and its manufacturing method.

2. Description of the Related Art

Recently, with the increase of the integration degree and operation velocity of the semiconductor device, copper (hereinafter called as "Cu") is used instead of aluminum (Al) or the like as a wiring material from the viewpoint of the reduction in resistance and high reliability of each wiring layer. The technology, which uses Cu as a wiring material, is increasing in importance for speed-up of the semiconductor device and the increase in stacked layers of a wiring structure with the advance of a microfabrication technology.

In the assembly process of a semiconductor device, a bonding step is performed to electrically connect each wiring layer of the semiconductor device and an outside conductive substance (e.g., a bonding pad of a package) via a metal wire or a conductive substance such as conductive bump. To perform the bonding step, a pad electrode layer and a metal wire or conductive bump of the semiconductor device are directly connected so to electrically conduct the respective wiring layers of the semiconductor device and the outside conductive substance. Specifically, the metal wire (e.g., gold (Au)) is directly bonded to the pad electrode layer or the conductive bump are formed on the pad electrode layer to make flip-chip connection.

Since the pad electrode layer is formed as a part of wiring on the top layer, the same material as the wiring layer of the semiconductor device is used. Therefore, Cu is conveniently used instead of Al or the like as a material for the pad electrode layer in the same way as the other wiring layer in view of reduction of the number of steps.

When a thermal treatment is performed with the top layer of the Cu wiring layer exposed to the atmosphere in order to form the pad electrode layer, the Cu wiring layer is readily oxidized from its surface to inside. Therefore, when Cu is used as a pad material, the bonding step cannot be performed while heating in the atmosphere by a conventional apparatus. In this case, the bonding step can be performed in a flow of nitrogen or hydrogen or in a non-oxidizing atmosphere or a reducing atmosphere with the surface of the pad electrode layer prevented from being oxidized, but it is necessary to make a major modification of the apparatus. In a step of heating treatment after the bonding, there is also a problem that a bonded part becomes defective because oxidation continues.

In connection with the above problems, Japanese Patent Laid-Open Application No. Hei 9-92649 JP-A discloses a method of forming an oxidation-resistant and corrosion-resistant protective layer on a copper wiring structure or a copper electrode pad structure (=copper pad electrode layer) within an opening.

It discloses a method of forming a copper-aluminum alloy layer (hereinafter called as "Cu—Al alloy layer") on the surface of a Cu wiring layer by forming an aluminum film (hereinafter called as "Al film") having a thickness of about 2% or less of that of the Cu film on a copper film (hereinafter called as "Cu film") configuring wires and a pad electrode and on an insulating film around it and performing a thermal treatment. Thus, there is disclosed a method of improving the reliability of the wiring structure or the pad electrode structure by forming an alloy film of a metal containing Al and preventing the Cu wiring layer from being oxidized or corroded.

Japanese Patent Laid-Open Application No. Hei 9-92649 JP-A discloses a subsequent method of wet-etching to remove the unreacted Al film remained on the insulating film with diluted hydrofluoric acid or phosphoric acid and thermally treating the Cu wiring layer in a mixture gas of hydrogen and oxygen or hydrogen and steam. Here, the Cu wiring layer is thermally treated again to form a thin film containing Al and oxygen or a thin oxide film containing Al, Cu and oxygen on the surface of the Cu—Al alloy layer. Thus, the reliability of the Cu wiring or the Cu electrode pad structure can be improved.

It is necessary to minimize the thickness of the Cu alloy film in order to suppress the resistance value of the pad electrode layer (e.g., Cu) from increasing. Accordingly, it is thinkable that the metal film (e.g., Al) formed on the pad electrode layer is made to be thin as small as possible.

Therefore, Japanese Patent Laid-Open Application No. Hei 9-92649 JP-A needs make the Cu—Al alloy layer thinner as small as possible in order to suppress the resistance value of the Cu electrode pad structure (=Cu pad electrode layer) from increasing. Thus, it is conceivable that the Al film is formed in a thickness as small as possible on the Cu film configuring the electrode pad structure.

However, if the metal film (e.g., Al) formed on the pad electrode layer is excessively thin, the following problems occur.

For example, the metal film agglomerates to have a spherical shape on the periphery of the pad electrode layer (=wiring layer on the top layer), namely on the insulating film such as a passivation film by the thermal treatment in the process of forming the alloy film on the pad electrode layer, and the metal layer has an increased thickness (corresponding to a diameter of the sphere).

In this case, an unnecessary portion of the metal film remained on the insulating film around the pad electrode layer is removed by a wet etching process or a CMP method (=chemical-mechanical polishing method), etc., but there is a problem that the processing time becomes long and a practical process margin cannot be obtained.

After the electrode pad of the Cu wiring structure is formed, a silicon wafer is generally inspected before an assembly process is performed to connect to an outside conductive substance (e.g., package bonding pad) through a conductive substance such as a metal wire (e.g., gold (Au)) or conductive bump. Here, a probing needle is contacted to the pad electrode layer of each semiconductor chip to inspect in the atmosphere so that a judgment is made to select a good chip only. After the inspection, only the good chips are subjected to the assembly process.

In this case, there comes a scratch of certain depth in the pad electrode layer when the pad electrode layer is contacted by the probing needle because it has a sharp tip. Therefore, when the pad electrode layer has a structure that the protective layer is formed on the Cu wiring layer, the probing needle breaks through the protective layer to reveal the Cu wiring layer located below it, resulting in oxidation in the later assembly step. Therefore, there is also a problem that a metal oxide layer on the pad electrode layer is readily cut away by the probing needle, and the oxidation resistance of the pad electrode layer is degraded.

Before the assembly step, a thermal treatment may be performed to form an oxidizing protective layer again on the scratch caused by the probing needle so to protect the pad electrode layer. However, it is impossible to form the metal oxide layer again because a metal required to form the metal oxide layer as the protective layer is not enough contained in the Cu wiring layer located on a lower layer. In the assembly step, particularly in the bonding step or the like, a bonding strength and conductivity become defective when the metal wire or conductive bump are connected to such pad electrode.

Thus, to form the pad electrode layer, it is necessary to consider not only the suppression of the wiring resistance value, oxidation resistance and corrosion resistance but also an effect on the later steps, such as a step of removing the unnecessary metal film, a wafer inspection step, a bonding step and the like.

Therefore, even the method disclosed in Japanese Patent Laid-Open Application No. Hei 9-92649 JP-A needs to consider an effect on the suppression of the wiring resistance value, the wafer inspection step, the bonding step and the like in forming the Cu electrode pad structure (=Cu pad electrode layer). For example, formation of the protective layer is not limited on the surface layer only by forming a material (=Al) on the Cu wiring layer, but it is necessary to form the Cu—Al alloy layer into the pad electrode layer though the resistance value of the pad electrode layer increases in order to secure the oxidation resistance and corrosion resistance of the entire pad electrode layer.

However, the method disclosed in Japanese Patent Laid-Open Application No. Hei 9-92649 JP-A merely puts emphasis on the formation of the Al film in a thickness as small as possible to form the Cu electrode pad structure so to suppress the resistance value from increasing but does not consider the aforementioned points.

Next, problems related to the inspection step of the silicon wafer by the prober will be further described. FIG. 25 is a diagram showing a cross section of the wiring pad structure as an example of prior art using the Cu multilayer wiring.

This prior wiring pad structure has an Al cap film 73 formed on a Cu pad 71 embedded in the surface of an insulating film 70 via a barrier metal film 72. The Al cap film 73 is to prevent the Cu pad 71 from being oxidized. In the figure, reference numerals 74, 75 denote insulating films. The Al cap film 73 contains, for example, Al as a main component and also a small amount of Cu (e.g., 0.5 wt %).

However, the conventional wiring pad structure has the following problems. Specifically, a probing needle 77 comes in contact with the Al cap film 73 about ten times if many in the probing step as shown in FIG. 26, the Al cap film 73 is broken due to delamination to expose the Cu pad 71 to the atmosphere, and the Cu pad 71 is broken if excessively contacted.

In case of the exposure to the atmosphere or breakage as described above, the exposed Cu pad 71 is oxidized, or a compound is produced by a reaction between Cu in the exposed Cu pad 71 and Al in the Al cap film 73.

As a result, there is a problem that the wire bonding resistance is degraded or the pad section has a greatly increased resistance. Besides, when oxidation reaches the deep section of the wiring layer, a problem such as fatal deterioration occurs in the wiring characteristic such as electro-migration (EM) resistance, stress migration (SM) resistance or the like in addition to the aforementioned problem.

As described above, the conventional wiring pad structure might have the Al cap film broken when contacted by the probing needle in the probing step, and the Cu pad may be revealed or broken. Thus, it is probable that the wire bonding resistance is degraded, the resistance of the pad section is increased, and the wiring characteristics such as the EM resistance or the SM resistance are fatally degraded.

Then, problems of a semiconductor device using the Cu wiring which has as the pad structure a Cu layer and an Al layer as its upper layer and a barrier metal layer disposed between the Cu layer and the Al layer will be described.

When a semiconductor device has a multilayer wiring structure having wiring on multiple layers, for example, the surface (exposed surface) of wiring formed on the top layer is used as a wiring pad for external connection. When the wiring is formed of Cu, the protective conducting layer excelling in resistance to oxidation is generally used as a cap film to protect the Cu layer (Cu wiring) because Cu is not resistant to oxidation, and especially the Al film is used as a cap film.

However, Al and Cu are highly reactive, so that when the Al cap film is directly stacked on the Cu surface, there is a problem that an intermetallic compound is formed and a resistance is increased by the subsequent major step which is a passivation deposition step or a thermal process such as a connection step by bump connection or wire bonding. To avoid such a problem, a Ta-based or Ti-based barrier metal film is generally disposed between the Cu wiring and the Al cap film.

The barrier metal film is required to have a mechanical strength to external forces such as probing, wire bonding and the like in addition to the aforementioned Cu, Al diffusion barrier properties. But, there may be a problem that the barrier metal film having a general laminated structure formed of two layers of $Ta_2N$ and Ta is sheared due to delamination caused when probing. In the barrier metal forming process, there may be a problem that dust (particles) increases in the sputtering step when a layer of $Ta_2N$ of the Ta-based barrier metal is made thick, and the barrier properties are degraded due to existence of the dust.

SUMMARY

A semiconductor device according to an embodiment of the present invention is comprised of a copper wiring layer formed above a semiconductor substrate; a pad electrode layer which conducts electrically to the copper wiring layer and has an alloy containing copper and a metal having a higher oxidation tendency than copper formed to reach bottom surface of the pad electrode layer; and an insulating protective film having an opening extended to the pad electrode layer.

A method of manufacturing a semiconductor device according to an embodiment of the present invention is comprised of forming an insulating film above a semiconductor substrate; forming a copper wiring layer in the insulating film; forming an insulating protective film on the copper wiring layer; forming an opening extended to the copper wiring layer in the insulating protective layer; forming a film of a metal having a higher oxidation tendency than copper or a film of an alloy containing a metal having a higher oxidation tendency than the copper on the copper wiring layer in the opening; and performing a thermal treatment to diffuse the metal or the alloy in the copper wiring layer so that an alloy containing copper and a metal whose oxidation tendency is higher than copper extended to the bottom surface of the copper wiring layer is formed to form a pad electrode layer, and an oxide layer mainly comprising the metal on the surface layer of the pad electrode layer is formed.

Another method of manufacturing a semiconductor device according to an embodiment of the invention is comprised of forming an insulating film above a semiconductor substrate; forming a copper wiring layer in the insulating film; forming an insulating protective film on the copper wiring layer; forming an opening extended to the copper wiring layer in the insulating protective layer; and forming a film of a metal whose oxidation tendency is higher than copper or a film of an alloy containing a metal whose oxidation tendency is higher than copper on the copper wiring layer in the opening while heating, thereby diffusing the metal or the alloy in the copper wiring layer so that an alloy containing copper and a metal whose oxidation tendency is higher than copper extended to the bottom surface of the copper wiring layer is formed to form a pad electrode layer, and an oxide layer mainly comprising the metal on the surface layer of the pad electrode layer is formed.

A semiconductor device according to another embodiment of the invention is comprised of a wiring pad; an insulating film which is formed on the wiring pad and has plural contact holes extended to the wiring pad; and a conducting protective layer which is disposed on the wiring pad via the insulating film and electrically connected to the wiring pad through the plural contact holes.

Another semiconductor device according to another embodiment of the invention is comprised of a insulating film having an opening; plural insulating pillars disposed in the opening; a wiring pad embedded in the opening to extend to its midway; and a conducting protective layer to the wiring pad which is disposed on the wiring pad so to fill the opening.

A semiconductor device according to still another embodiment of the invention is comprised of a wiring disposed in a predetermined pattern above a substrate; a protecting conductive layer disposed on a pad section of the wiring; and a barrier film which is disposed between the wiring and the conducting protective layer and formed by stacking two pairs or more of a layer made of a predetermined metal element and a layer made of a compound mainly comprising the metal element.

BRIEF DESCRIPTION OF THE DRAWINGS

FIG. 2 is a sectional diagram showing a semiconductor device according to a modified example of the first embodiment.

FIG. 3 is a table showing a relation between an Al concentration on the surface of a CuAl alloy layer and bonding properties according to the first embodiment.

FIG. 10 is a diagram showing the result of a shear test, which was conducted after forming a pad electrode layer including a surface oxide layer and then bonding, in comparison with the result of a shear test, which was conducted after forming a pad electrode layer including a surface oxide layer, performing an acid treatment of the surface and bonding.

FIG. 20 is a table showing the results of a comparative example among the test results related to the properties of the semiconductor device according to the ninth embodiment.

FIG. 21 is a table showing the results of a first example about the properties of the semiconductor device according to the ninth embodiment.

FIG. 22 is a table showing the results of a second example about the properties of the semiconductor device according to the ninth embodiment.

FIG. 23 is a table showing the results of a third example about the properties of the semiconductor device according to the ninth embodiment.

FIG. 24 is a table showing the results of a fourth example about the properties of the semiconductor device according to the ninth embodiment.

DETAILED DESCRIPTION OF THE INVENTION

Explanation of Embodiments

Figure 1A:
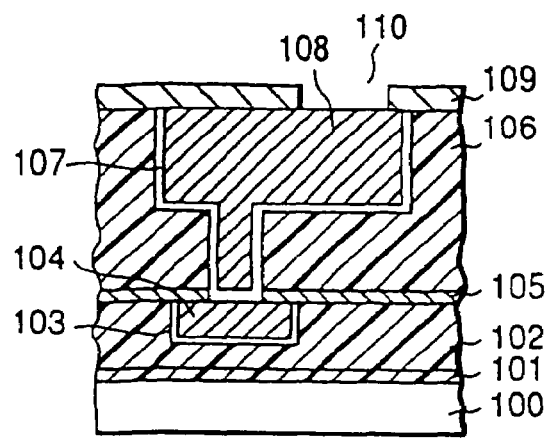
FIG. 1A, FIG. 1B, FIG. 1C, FIG. 1D and FIG. 1E are sectional diagrams showing a step of manufacturing a semiconductor device according to a first embodiment of the present invention.

According to an embodiment of the present invention, a semiconductor device, which is fast and highly reliable by using a low resistant copper (Cu) wiring layer, is provided.

As an implementation mode, the metal whose oxidation tendency is higher than copper contains at least one among aluminum (Al), titanium (Ti), tantalum (Ta), zirconium (Zr), vanadium (V), tin (Sn), tungsten (W), cobalt (Co), iron (Fe), nickel (Ni), ruthenium (Ru), chromium (Cr), molybdenum (Mo), niobium (Nb), hafnium (Hf), magnesium (Mg) and beryllium (Be).

As an implementation mode, a concentration of the metal having a higher oxidation tendency than copper in the pad electrode layer is higher in a region near the top surface and becomes low under the top surface.

As an implementation mode, a concentration of the metal having a higher oxidation tendency than copper is 2 atm % or more in a region in the vicinity of the top surface of the pad electrode layer.

As an implementation mode, the aforementioned pad electrode layer has an oxide layer, which mainly comprises the metal having a higher oxidation tendency than copper, as a surface layer, and a conductive substance is electrically connected to the pad electrode layer penetrating a part of the oxide layer.

As an implementation mode, the pad electrode layer has a first oxide layer on its surface and is formed into a laminated form, below the first oxide layer, which includes a first alloy layer containing copper and a metal having a higher oxidation tendency than copper, a second oxide layer, and a second alloy layer in which a concentration of the metal having a higher oxidation tendency than the copper is lower than the first alloy layer in this order.

As an implementation mode, the pad electrode layer has a structure into which an insulating substance is intruded.

As an implementation mode, the conductive substance is a conductive wire or a conductive bump, and bonded to the pad electrode layer.

As an implementation mode, a concentration of copper is 10 atm % or less on average in a portion ranging from the surface to a depth of 2 nm of the pad electrode layer.

According to a manufacturing method of an embodiment of the invention, a semiconductor device having high reliability can be manufactured by using a low resistant copper (Cu) wiring layer and performing bonding connection or the like with the pad electrode layer which is present in an opening of an insulating protective film and electrically connected to the copper (Cu) wiring layer.

A manufacturing method according to an implementation mode further comprises removing the oxide layer which is present on the copper wiring layer before forming a film of the metal whose oxidation tendency is higher than copper or an alloy film containing the metal whose oxidation tendency is higher than copper.

In a manufacturing method according to an implementation mode, the oxide layer present on the copper wiring layer is removed by performing a thermal treatment in an atmosphere of hydrogen.

As an implementation mode, the thermal treatment to diffuse the metal or the alloy is performed in an atmosphere containing oxygen, and a partial pressure of oxygen is $1 \times 10^{-5}$ Pa or less.

As an implementation mode, the thermal treatment to diffuse the metal or the alloy is performed at a temperature of 300° C. to 450° C.

As an implementation mode, the thermal treatment to diffuse the metal or the alloy is performed by laser annealing or rapid thermal annealing.

As an implementation mode, heating to form the metal film or the alloy film and to diffuse the metal or the alloy film is performed at a temperature of 300° C. to 450° C.

In a manufacturing method as an implementation mode, the forming the film of metal whose oxidation tendency is higher than copper or the alloy film containing metal whose oxidation tendency is higher than copper on the copper wiring layer in the opening is performed while simultaneously forming a film of metal whose oxidation tendency is higher than copper or an alloy film containing metal whose oxidation tendency is higher than copper on the insulating protective film, and there is further comprised of removing the film of metal whose oxidation tendency is higher than copper or the alloy film containing metal whose oxidation tendency is higher than copper present on the insulating protective film after the thermal treatment.

In a manufacturing method as an implementation mode, the forming the film of metal whose oxidation tendency is higher than copper or the alloy film containing metal whose oxidation tendency is higher than copper on the copper wiring layer while heating is performed while simultaneously forming a film of metal whose oxidation tendency is higher than copper or an alloy film containing metal whose oxidation tendency is higher than copper on the insulating protective film, and there is further comprised of removing the film of metal whose oxidation tendency is higher than copper or the alloy film containing metal whose oxidation tendency is higher than copper present on the insulating protective film after forming the pad electrode layer and forming the oxide layer mainly containing the above metal.

As an implementation mode, the removing the film of metal whose oxidation tendency is higher than the copper or the alloy film containing metal whose oxidation tendency is higher than copper present on the insulating protective film forms a mask on the pad electrode layer in the opening in order to remove the metal film or the alloy film.

In a manufacturing method as an implementation mode, the forming the film of metal whose oxidation tendency is higher than copper or the alloy film containing metal whose oxidation tendency is higher than copper on the copper wiring layer in the opening is performed while simultaneously forming a film of metal whose oxidation tendency is higher than copper or an alloy film containing metal whose oxidation tendency is higher than copper on the insulating protective film, the method further containing connecting a conductive substance, which is electrically connectable to an external conductive substance, to the formed pad electrode layer to electrically connect the conductive substance and the copper wiring layer through the pad electrode layer, and removing the film of metal whose oxidation tendency is higher than copper or the alloy film containing metal whose oxidation tendency is higher than copper present on the insulating protective film in the state that the pad electrode layer and the conductive substance are connected.

In a manufacturing method as an implementation mode, the forming the film of metal whose oxidation tendency is higher than copper or the alloy film containing metal whose oxidation tendency is higher than copper on the copper wiring layer while heating is performed while simultaneously forming a film of metal whose oxidation tendency is higher than copper or an alloy film containing metal whose oxidation tendency is higher than copper on the insulating protective film, the method further including connecting a conductive substance, which is electrically connectable to an external conductive substance, to the formed pad electrode layer to electrically connect the conductive substance and the copper wiring layer through the pad electrode layer, and removing the film of metal whose oxidation tendency is higher than copper or the alloy film containing metal whose oxidation tendency is higher than copper present on the insulating protective film in the state that the pad electrode layer and the conductive substance is connected.

As an implementation mode, the metal whose oxidation tendency is higher than copper contains at least one among aluminum (Al), titanium (Ti), tantalum (Ta), zirconium (Zr), vanadium (V), tin (Sn), tungsten (W), cobalt (Co), iron (Fe), nickel (Ni), ruthenium (Ru), chromium (Cr), molybdenum (Mo), niobium (Nb), hafnium (Hf), magnesium (Mg) and beryllium (Be).

As an implementation mode, the film of metal whose oxidation tendency is higher than copper or the alloy film containing metal whose oxidation tendency is higher than copper is formed in a thickness of larger than 10 nm on the insulating protective film and on the copper wiring layer of the opening.

As an implementation mode, the removing the film of metal whose oxidation tendency is higher than copper or the alloy film containing metal whose oxidation tendency is higher than copper present on the insulating protective film is performed by a wet etching process or a CMP method.

As an implementation mode, the wet etching process is performed with an acid.

As an implementation mode, the acid is selected from phosphoric acid, hydrofluoric acid and hydrochloric acid.

As an implementation mode, the wet etching process is performed with phosphoric acid or hydrofluoric acid and then with hydrochloric acid.

A manufacturing method as an implementation mode further comprises performing the thermal treatment after the wet etching process to form an oxide layer mainly comprising the metal on the surface layer of the pad electrode layer.

As an implementation mode, the thermal treatment after the wet etching is performed in an atmosphere containing oxide, and a partial pressure of the oxygen is $1 \times 10^{-5}$ Pa or less.

As an implementation mode, the thermal treatment after the wet etching is performed at a temperature of 300° C. to 450° C.

As an implementation mode, the thermal treatment after the wet etching is performed by a laser annealing process or a rapid thermal annealing process.

A manufacturing method as an implementation mode further comprises connecting a conductive substance, which is electrically connectable to an external conductive substance, to the formed pad electrode layer so to electrically connect the conductive substance and the copper wiring layer through the pad electrode layer.

As an implementation mode, in the electrically connecting the conductive substance and the copper wiring layer through the pad electrode layer the conductive substance penetrates partly through the oxide layer, which mainly comprises metal whose oxidation tendency is higher than the copper, so to electrically connect to the pad electrode layer.

As an implementation mode, in the electrically connecting the conductive substance and the copper wiring layer through the pad electrode layer the conductive substance is a conductive wire or a conductive bump and connected to the pad electrode layer by bonding.

Besides, according to another embodiment of the present invention, even when the conducting protective layer is broken by a probing needle, a wiring pad can be prevented from being exposed to the atmosphere or broken by an insulating film present below the conducting protective layer. Thus, reliability can be prevented from being degraded.

As an implementation mode, the plural contact holes are formed in the edge portion of the wiring pad.

As an implementation mode, the contact holes have a diameter of 0.5 μm or more to 10 μm or less.

According to still another embodiment of the present invention, a pad structure having plural insulating pillars dispersed is formed in a laminate of wiring pad/conducting protective layers, so that a damage to the wiring pad structure when contacted by the probing needle can be eased by the plural insulating pillars. Additionally, the reliability can be prevented from degrading because the pad structure has the interface between the wiring pad and the conducting protective layer located below the top surface of the insulating pillars.

As an implementation mode, the plural insulating pillars have a length of 0.5 μm or more to 10 μm or less between the neighboring insulating pillars.

As an implementation mode, a material for the wiring pad is Cu, and a material for the conducting protective layer is Al or an Al alloy.

As an implementation mode, a material for the wiring pad is Cu, and a material for the conducting protective layer is a Cu alloy, Al or an Al alloy.

According to still another embodiment of the present invention, each layer configuring the barrier film can be made thin and has a high mechanical strength and high barrier properties. Additionally, dust produced in the film forming process can be reduced substantially by virtue of thinning of each layer and a pasting effect of a layer made of metal elements, so that an electric defect due to the dust can be substantially eliminated, and the barrier properties can be improved.

As an implementation mode, the barrier film has each layer configuring the pair formed in a thickness of 5 nm or more to 30 nm or less.

As an implementation mode, the barrier film is formed by stacking six pairs or less.

As an implementation mode, the barrier film is formed of the same pairs only.

As an implementation mode, the metal element is selected from Group IVa, Group Va or Group VIa.

As an implementation mode, the compound is nitride.

As an implementation mode, the wiring is formed of Cu, the protective conducting layer is formed of Al, and the barrier film is formed of a pair of Ta and $Ta_2N$.

Respective embodiments of the present invention will be described with reference to the accompanying drawings.

First Embodiment

A first embodiment will be described with reference to FIG. 1A to FIG. 1E, FIG. 2, FIG. 3, and FIG. 4A to FIG. 4E.

In this embodiment, Cu is used as a material for the wiring layer, and aluminum (Al) is used as metal whose oxidation tendency is higher (easily oxidized) than Cu.

FIG. 1A to FIG. 1E show sectional diagrams of a direction in which wiring on the wiring layer, which is located on the top layer and has the pad electrode layer, extends.

First, a thermal oxidation silicon film (=$SiO_2$ film) 101 is formed with a thickness of about 100 nm on a silicon (Si) substrate 100, and a silicon oxide film 102 is formed with a thickness of about 1 μm by a CVD method.

Then, a so-called PEP process is performed by a lithography technology to form a pattern of a photoresist film on the silicon oxide film 102. The pattern is then used as a mask to perform dry etching to form a wiring pattern groove having a width of 1.3 μm and a depth of 700 nm on the silicon oxide film 102.

Then, a TaN film (tantalum nitride film) 103 is formed with a thickness of about 20 nm in the groove for the wiring pattern by the sputtering technique. Then, a Cu film is formed with a thickness of about 200 nm by the sputtering technique, and the groove for the wiring pattern is filled with Cu by an electroplating method using copper sulfate. Then processing by a chemical mechanical polishing method (=CMP method) is performed to form a Cu wiring layer 104 (=lower wiring layer) by burying.

Then, an SiN film (silicon nitride film) 105 with a thickness of about 100 nm and a silicon oxide film 106 with a thickness of about 2 μm are formed sequentially on the entire surface of the Cu wiring layer 104 by the CVD method.

Then, a so-called PEP process is conducted by the lithography technology to form a pattern of photoresist film on a silicon oxide film 106. Then, the pattern of the resist film is used as a mask, and the silicon oxide film 106 and the SiN film 105 are sequentially etched to form a groove for the wiring pattern with a depth of 1.2 μm and a width of 1.0 μm and via holes which reach the Cu wiring layer 104 (=lower wiring layer).

A TaN film (tantalum nitride film) 107 is formed with a thickness of about 20 nm in the groove for the wiring pattern by the sputtering technique. Then, a Cu film is formed with a thickness of about 200 nm by the sputtering technique, and the groove for the wiring pattern is filled with Cu by the electroplating method using copper sulfate. Processing by the CMP method is performed to form a Cu wiring layer 108 (=upper wiring layer) by burying so to form a dual damascene wiring structure.

Then, an SiN film (silicon nitride film) 109 is formed with a thickness of 200 nm as an insulating protective film by the CVD method. A so-called PEP process is performed by the lithography technology to form a pattern of the photoresist film on the SiN Film 109. Then, the SiN film 109 is etched with the pattern of the resist film used as a mask to form an opening 110 to expose a part of the Cu wiring layer 108 (the above step is shown in FIG. 1A).

Figure 1D:
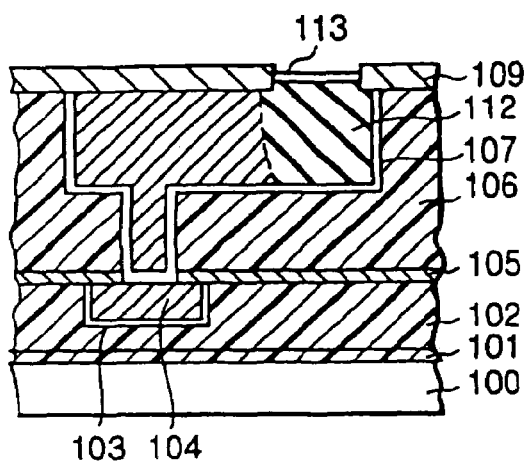
Figure 1B:
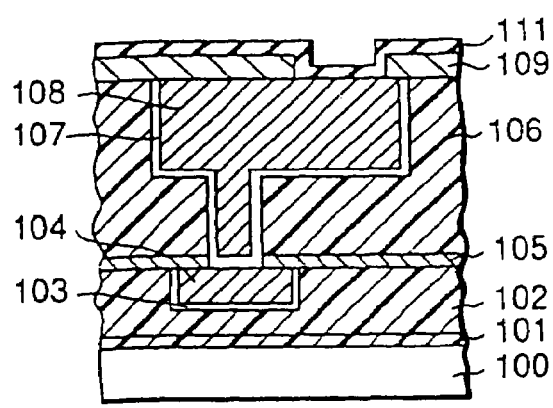

An aluminum copper alloy film (hereafter called as "AlCu film" 111) which comprises aluminum (Al) and 0.5 wt % of Cu is formed with a thickness of about 20 nm to cover the Cu wiring layer 108 (=upper wiring layer) and the SiN film 109 by an existing non-heating sputtering technique (the above step is shown in FIG. 1B).

Then, a silicon wafer is carried out of the sputtering system and carried into a predetermined reaction chamber, such as a vacuum oven etc, to perform thermal treatment.

Here, a temperature is set to about 400° C., and the thermal treatment is performed in an atmosphere containing a small amount of oxygen for about three hours. An AlCu film 111 (on the Cu wiring layer 108) reacts with the component of the Cu wiring layer 108 by the thermal treatment to form a CuAl layer 112, namely a pad electrode layer. At this time, an oxide layer 113 mainly comprising aluminum is formed on the surface layer of the CuAl layer 112 (=pad electrode layer).

Figure 1E:
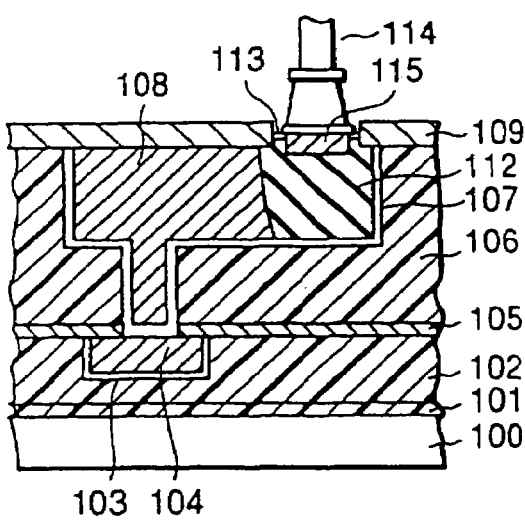
Figure 1C:
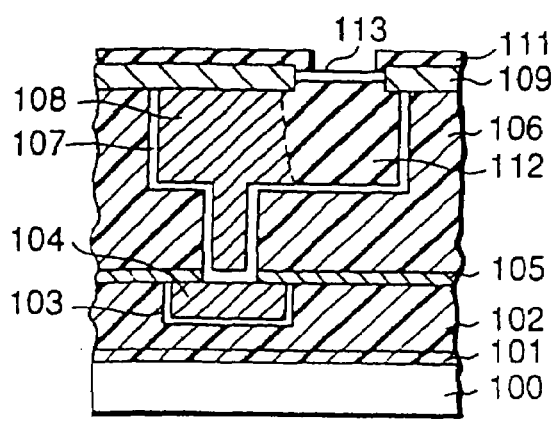

Here, alloy components of aluminum and copper of the AlCu film 111 are diffused into the Cu wiring layer 108 in the process of thermal treatment, and the Cu wiring layer 108 is partly alloyed. At this time, a reaction layer (=alloy layer) with the component of the Cu wiring layer 108 (=upper wiring layer) is formed in the AlCu film 111. The CuAl layer 112 comprises the alloyed part reaching the bottom surface of the Cu wiring layer 108 and the reaction layer (=alloy layer) of the AlCu film 111, and configures the pad electrode layer. (The above step is shown in FIG. 1C.)

An oxide layer 113 mainly comprising aluminum acts, as a protective layer having oxidation resistance, on the CuAl layer 112 (=pad electrode layer).

In this embodiment, an oxygen supply amount is adjusted so that a partial pressure of oxygen in an atmosphere becomes $1 \times 10^{-5}$ (Pa) or less, to prevent the Cu component of the Cu wiring layer 108 from being oxidized in the opening 110 so to react the Cu interconnect layer 108 and the AlCu film 111 over a relatively long time to form the CuAl layer 112 (pad electrode layer), and the oxide layer 113 mainly comprising aluminum is formed on only the surface of the CuAl layer 112 (=pad electrode layer).

Here, when the partial pressure of oxygen is in this range (=$1 \times 10^{-5}$(Pa) or less), the atmosphere is not especially limited to a particular one. The oxide layer 113 mainly comprising aluminum can be formed in a high vacuum, an atmosphere of nitrogen or an atmosphere of a forming gas (=mixed gas of nitrogen and hydrogen).

Besides, if the treatment is not performed before the AlCu film 111 is formed, the oxygen component of natural oxide film formed on the surface of the Cu wiring layer 108 reacts with the AlCu film 111 during the thermal treatment, and the oxide film 113 (=interface oxide layer) which mainly comprises aluminum, is formed on the interface of the AlCu film 111 and the Cu wiring layer 108 prior to their mutual reaction. A detailed sectional diagram of the structure described above is shown in FIG. 2.

In this structure, the oxide layer 113 (=interface oxide layer) mainly comprising aluminum prevents the diffusion of Al into the Cu wiring layer 108 as shown in FIG. 2. Therefore, in the CuAl layer 112 (=pad electrode layer), a CuAl layer (=low Al concentration) including a low concentration of Al is formed below the boundary of the oxide layer 113 (=interface oxide layer) mainly comprising aluminum and a CuAl layer (=high Al concentration) including a high concentration of Al is formed in a region above the aforementioned interface oxide layer. As a result, the Al concentration diffused in the Cu wiring layer 108 is kept at a low value, and the resistance value of the Cu wiring layer 108 can be prevented from increasing.

In this embodiment, a temperature for the thermal treatment may be set to fall in a range of 300° C. to 450° C.

Here, in the CuAl layer 112 (=pad electrode layer), an amount of oxygen in the atmosphere is controlled to be as low as possible so that the Al component is oxidized but the Cu component is not oxidized. Therefore, a mixed gas of hydrogen and oxygen is not used to reduce the oxidation state with hydrogen, but the CuAl layer 112 (=pad electrode layer) can be formed without especially specifying a type of atmosphere as described above.

This step can also be performed by an existing heat sputtering technique. It will be described below.

For example, the silicon substrate 100 is heated to reach a temperature of about 400° C., and in this state, the sputtering technique is performed to form the AlCu film 111 with a thickness of about 20 nm to cover the Cu wiring layer 108 (=upper wiring) and the SiN film 109.

In this case, the AlCu film 111 reacts with the component of the Cu wiring layer 108 while it is formed on the Cu wiring layer 108 by heating at the temperature same as in the thermal treatment performed after the above-mentioned non-heat sputtering technique to form the CuAl layer 112, namely the pad electrode layer. At this time, the oxide layer 113 mainly comprising aluminum is formed on the surface layer of the CuAl layer 112 (=pad electrode layer).

Here, the alloy components, aluminum and copper, of the AlCu film 111 are diffused in the Cu wiring layer 108 in the process of forming the film while heating, and the Cu wiring layer 108 is partly alloyed. At this time, a reaction layer (=alloy layer) with the component of the Cu wiring layer 108 is formed in the AlCu film 111. The CuAl layer 112 is formed of the alloyed part reaching the bottom surface of the Cu wiring layer 108 and the reaction layer (=alloy layer) of the AlCu film 111 and configures the pad electrode layer.

As described above, the oxide layer 113 mainly comprising aluminum acts, as a protective layer having resistance to oxidation, on the CuAl layer 112 (=pad electrode layer).

In this case, there are effects that the Cu wiring layer 108 can be alloyed partly in the process of forming the AlCu film 111 and the number of thermal treating steps can be decreased compared with the non-heat sputtering technique.

As described above, when the heat sputtering technique is used to form the AlCu film 111 without performing preprocessing of the Cu wiring layer 108, the oxygen content of the natural oxide film formed on the surface of the Cu wiring layer 108 reacts with the AlCu film 111 while heating, and an oxide layer (=interface oxide layer) mainly comprising aluminum is formed on the interface between the Cu wiring layer 108 and the AlCu film 111 (see FIG. 2). This point is the same as the case in which the non-heat sputtering technique is used.

In this embodiment, means such as laser annealing, an RTA method (=rapid thermal annealing method) or the like may be used as a method of heating the silicon substrate 100 and the like. In this case, time required for the thermal treatment can be reduced considerably.

Additionally, it is also possible to use a film of Al alone instead of the aforementioned alloy film of Al and Cu.

Then, the silicon wafer is carried into a spin etching unit.

Here, diluted hydrofluoric acid (HF) is supplied to the surface of the silicon substrate 100 and the wet etching is performed to remove the AlCu film 111 from the surface of the SiN film 109 (=insulating protective film). At this time, the CuAl layer 112 (=pad electrode layer) has resistance to dissolution, and the CuAl layer 112 (=pad electrode layer) only can be selectively remained (the above step is shown in FIG. 1D). Here, the wet etching is performed with an etching solution (e.g., 1 wt % concentration) prepared to a predetermined concentration for about one minute using.

By performing the wet etching, the AlCu film 111 is removed from the region other than the CuAl layer 112 (=pad electrode layer), and insulation between the CuAl layers 112 (=pad electrode layers) can be assured. However, the oxide layer 113 mainly comprising aluminum formed on the CuAl layer 112 (=pad electrode layer) is also dissolved gradually. Therefore, the conditions for the wet etching must be optimized considering an effect on other substances on the assumption that the AlCu film 111 on the region other than the CuAl layer 112 (=pad electrode layer) is completely removed.

For example, when the oxide layer 113 mainly comprising aluminum becomes thin because it is dissolved gradually by over-etching or the like and the effect of preventing the CuAl layer 112 (=pad electrode layer) from oxidizing lowers, thermal treatment is performed after the wet etching to form the oxide layer again or a predetermined process is performed to reinforce. In this case, the thermal treatment may be performed under the same conditions as the aforementioned ones, such as the atmosphere, temperature, etc. used.

It is also possible to shorten the time required for the thermal treatment by means such as laser annealing or RTA method (=rapid thermal anneal method).

Diluted hydrochloric acid (HCl) or phosphoric acid may be used other than diluted hydrofluoric acid (HF) on the surface of the silicon substrate 100. Specifically, diluted hydrofluoric acid (HF), diluted hydrochloric acid (HCl) or phosphoric acid may be used independently or the wet etching with each of them can be performed in combination on the surface of the silicon substrate 100. For example, it is possible that diluted hydrofluoric acid (HF) or phosphoric acid is supplied, then diluted hydrochloric acid (HCl) is supplied to dissolve and remove the AlCu film 111 on the SiN film 109.

In this case, diluted hydrofluoric acid (HF) or phosphoric acid dissolves the AlCu film 111 and also gradually dissolves the oxide layer 113 mainly comprising aluminum on the surface of the CuAl layer 112 (=pad electrode layer). Meanwhile, a dissolving rate of the oxide layer 113 mainly comprising aluminum can be suppressed to a small value using diluted hydrochloric acid (HCl). Therefore, when diluted hydrochloric acid (HCl) is used for the wet etching, the AlCu film 111 on the SiN film 109 (=insulating protective film) can be removed without over-etching the oxide layer 113 mainly comprising aluminum on the surface of the CuAl layer 112 (=pad electrode layer). In this case, the processing margin of the wet etching can be increased.

Then, the silicon wafer is carried into an inspection unit, and the inspection is performed to inspect each semiconductor chip for its quality.

Here, an auto prober and a probing card are used to contact to the CuAl layer 112 (=pad electrode layer) so to judge in the atmosphere whether each semiconductor chip is good or not. When touched by the probing needle, the oxide layer 113 mainly comprising aluminum is scratched because the probing needle has a sharp tip, and an intruded mark with a certain depth is left in the CuAl layer 112 (=pad electrode layer). At this time, the oxide layer 113 (=metal oxide layer) mainly comprising aluminum formed on the surface of the CuAl layer 112 (=pad electrode layer) is scratched away, and if it is left as it is, there is a problem that the resistance to oxidation of the CuAl layer 112 (=pad electrode layer) is degraded.

Therefore, the silicon wafer is carried into a vacuum oven and heated again at a temperature of 400° C. for 15 minutes while supplying the atmosphere having a partial pressure of oxygen of $1 \times 10^{-5}$ Pa or less. Thus, the oxide layer mainly comprising aluminum can be formed again on the mark left on the CuAl layer 112 (=pad electrode layer) by the probing needle.

When an amount of Al contained in the CuAl layer 112 (=pad electrode layer) is less than the required amount, the CuAl layer 112 (=pad electrode layer) cannot be protected by forming the oxide layer mainly comprising aluminum.

Then, an existing bonding process is applied to the CuAl layer 112 (=pad electrode layer) to electrically connect the Cu wiring layer 108 and an outside substance (e.g., bonding pad of package) having conductivity in the atmosphere. Here, an existing wire bonding process is performed as one example. Specifically, a metal wire 114 (=e.g., gold (Au)) is used as a conductive substance and directly bonded to the CuAl layer 112 (=pad electrode layer) under heating and pressing by an existing bonding tool to conduct the Cu wiring layer 108 and the conductive outside substance (e.g., bonding pad of package) through the pad electrode layer (the above step is shown in FIG. 1E).

In the process of performing the bonding, the oxide layer (=surface oxide layer in FIG. 2) mainly comprising aluminum of the CuAl layer (=pad electrode layer) is partly broken to reveal the CuAl layer 112, and an alloy composition 115 is produced in a mechanically and electrically connected state on the bonding between the revealed CuAl layer 112 (=pad electrode layer) and the wire 114.

At this time, the oxide layer 113 mainly comprising aluminum is formed again on the surface of the mark caused by the probing needle as described above in this embodiment. Therefore, the CuAl layer 112 (=pad electrode layer) is not oxidized while the bonding is performed in the atmosphere, so that good bonding characteristics are indicated.

The bonding step directly connects conductive bump or the like with the CuAl layer 112 (=pad electrode layer) without using the metal wire 114 and can conduct the Cu wiring layer 108 and the conductive outside substance (e.g., bonding pad of package) through the pad electrode layer.

The metal wire and conductive bump are formed of metal such as gold (Au), aluminum (Al), lead (Pb), tin (Sn), indium (In), gallium (Ga), bismuth (Bi), antimony (Sb) or silver (Ag) used alone, or an alloy containing such metals.

After bonding according to the aforementioned procedure, a high temperature storage examination was conducted at a temperature of 200° C. for about 2,000 hours. As a result, it was found that a bonding resistance of the CuAl layer 112 (=pad electrode layer) did not rise and a good joining state was held.

In this embodiment, the AlCu film 111 is formed with the thickness of about 20 nm on the Cu wiring layer 108 in the state that the natural oxide film is formed on the surface and the thermal treatment is performed at about 400° C. for a long time (e.g., three hours) as described above. Thus, it is considered that the oxide layer 113 mainly comprising aluminum was formed with an adequate thickness on the surface layer of the CuAl layer 112 (=pad electrode layer), oxidation of the CuAl layer 112 (=pad electrode layer) is suppressed, and the bonding was performed in a good condition.

Meanwhile, when the AlCu film 111 has a thickness of less than 10 nm and the thermal treatment is similarly performed at a temperature of 400° C. for about three hours, the AlCu film 111 agglomerates into a spherical shape on the SiN film 109 (=insulating protective film). In such a case, if the time of wet etching with diluted hydrofluoric acid (HF) is not set to be long, the AlCu film 111 on the SiN film 109 cannot be removed thoroughly. Therefore, it affects on the efficiency of the manufacturing process as the whole, and the oxide layer 113 mainly comprising aluminum on the CuAl layer 112 (=pad electrode layer) is also dissolved to degrade the resistance to oxidation, so that it becomes impossible to secure a sufficient process margin.

Additionally, when the Cu wiring layer 108 has a thickness of about 1.2 μm as in this embodiment and the AlCu film 111 has a thickness of less than 10 nm, most of the Al component is diffused in the Cu wiring layer 108 in the process of their reactions. Therefore, the oxide layer 113 mainly comprising aluminum is not formed with a sufficient thickness on the surface layer of the CuAl layer 112 (=pad electrode layer). Besides, when the treatment with diluted hydrofluoric acid (HF) is performed for a long time as described above, the oxide layer 113 mainly comprising aluminum on the surface layer is readily removed because its thickness is insufficient, and the effect of preventing the CuAl layer 112 (=pad electrode layer) from oxidizing is lost.

When the wire bonding is performed in the atmosphere in the aforementioned state, the oxidation proceeds not only on the portion where the mark was formed by the probing needle but also partly on the surface layer of the CuAl layer 112 (=pad electrode layer). Therefore, it becomes impossible to connect by wire bonding as described above.

The table shown in FIG. 3 shows bonding properties examined after the treatment with diluted hydrofluoric acid (HF) processing with variations in the Al concentration (unit: atm %) contained in the surface layer of the CuAl layer 112 (=pad electrode layer).

The surface layer in this embodiment is a layer from the surface to a depth of about 50 nm.

FIG. 3 shows symbols X, Δ, O to indicate pass/fail criteria of the bonding properties with respect to each Al concentration contained in the surface layer of the CuAl layer 112 (=pad electrode layer). Symbol X indicates that the bonding was impossible because the pad electrode layer is oxidized to its interior. Symbol A indicates that oxidation did not occur but a strength of bonding (=shear strength) was insufficient. Symbol O indicates that a strength of bonding was sufficient.

As shown in FIG. 3, it is seen that when the Al concentration contained in the surface layer of the CuAl layer 112 (=pad electrode layer) is 1.5 atm % or more, bonding is possible, and when it is 2 atm % or more at the same ratio, a strength of bonding can be obtained sufficiently.

Meanwhile, it is seen that when the Al concentration contained in the surface layer of the CuAl layer 112 (=pad electrode layer) is 1 atm % or less, bonding cannot be made. It is because most of the Al component is diffused in the Cu wiring layer 108, and an amount of the Al component on the surface layer of the CuAl layer 112 (=pad electrode layer) is not enough to form the oxide layer 113 mainly comprising aluminum in an adequate thickness. Therefore, in the process of treatment with diluted hydrofluoric acid (HF), the oxide layer 113 mainly comprising aluminum is readily removed from the surface layer, and the effect of preventing the CuAl layer 112 (=pad electrode layer) from oxidizing is lost.

It is apparent from the result that the Al concentration contained in the surface layer of the CuAl layer 112 (=pad electrode layer) is desired to be 2 atm % or more for the bonding.

The alloy of aluminum (Al) and copper (Cu) has an electrical resistance higher than that of Al or Cu alone. It is not preferable to increase the thickness of the AlCu film 111 to a level more than necessary in order to increase the Al concentration contained in the surface layer of the CuAl layer 112 (=pad electrode layer) because a resistance value is increased at the junction between the CuAl layer 112 (=pad electrode layer) and the conductive substance (e.g., wire 114) even after the change into the CuAl layer 112 (=pad electrode layer). Additionally, it is also not preferable because a processing time increases when the AlCu film 111 which is on the SiN film 109 (=insulating protective film) around the CuAl layer 112 (=pad electrode layer) is removed.

Therefore, when the Cu wiring layer 108 has a thickness of about 1.2 μm as in this embodiment, the AlCu film 111 may have a thickness of about 10 nm or more to about 100 nm or less. Specifically, when the upper limit of the thickness of the AlCu film 111 is about 10% at a ratio with respect to the thickness of the Cu wiring layer 108, the increase of the resistance value of the CuAl layer 112 (=pad electrode layer) and the treating time can be suppressed.

In this embodiment, it is also possible to remove the natural oxide film formed on the surface of the Cu wiring layer 108 and then to form the AlCu film 111 on the Cu wiring layer 108.

In this case, the surface of the Cu wiring layer 108 is heated with exposure to the hydrogen atmosphere to remove the natural oxide film formed on the surface. Here, for example, a hydrogen partial pressure is set to 0.2 Pa and a temperature is set to 350° C., and the thermal treatment is performed for about three minutes. Then, the AlCu film 111 is formed on the Cu wiring layer 108 by an existing non-heat sputtering technique, then the thermal treatment is performed as described above to form the CuAl layer 112 (=pad electrode layer) and the oxide layer 113 mainly comprising aluminum.

Thus, when the natural oxide film is previously removed, an interface oxidation layer (see FIG. 2) is not formed on the CuAl layer 112 (=pad electrode layer). Therefore, after the AlCu film 111 is formed on the Cu wiring layer 108 by the non-heat sputtering technique, the Al component is quickly diffused in the Cu wiring layer 108 in the process of thermal treatment, and the thermal treating time after the non-heat sputtering can be shortened.

For example, when the thermal treatment was performed at a temperature of 400° C. for about 30 minutes, the bonding properties were especially good, and the same effect as in the aforementioned case in this embodiment could be obtained. The result was also the same on the Al concentration contained in the surface layer of the CuAl layer 112 (=pad electrode layer).

Additionally, it can also be applied to the formation of the AlCu film 111 on the Cu wiring layer 108 by an existing heat sputtering. In this case, the surface of the Cu wiring layer 108 is similarly heated with exposure to the hydrogen atmosphere to remove the natural oxide film formed on the surface in advance. Then, the silicon substrate 100 is kept at a high temperature of about 400° C., during which the AlCu film 111 is formed on the Cu wiring layer 108. Additionally, the CuAl layer 112 (=pad electrode layer) and the oxide layer 113 mainly comprising aluminum are formed in the AlCu film 111. Thus, diffusion can be promoted in such a way that the Al component reaches into the Cu wiring layer 108 in the process of forming and processing the AlCu film 111 on the Cu wiring layer 108 while the silicon substrate 100 is kept at a high temperature.

Thus, when the pad electrode layer is formed of an alloy layer as in this embodiment, it is provided with adequate resistance to oxidation and strength to a long use, and the reliability of the Cu wiring layer and also of the semiconductor device, can be enhanced better than before.

Figure 4A:
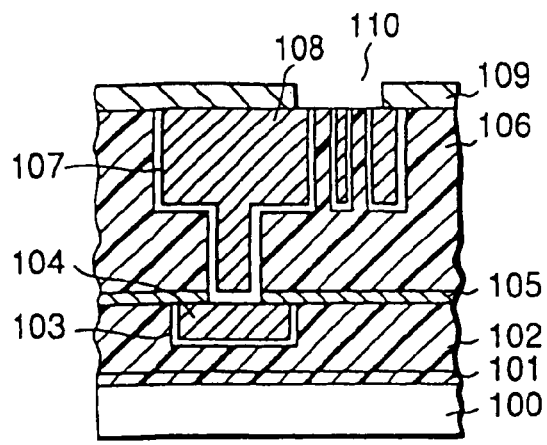
FIG. 4A, FIG. 4B, FIG. 4C and FIG. 4D are sectional diagrams showing a step of manufacturing a semiconductor device according to another modified example of the first embodiment.
Figure 4B:
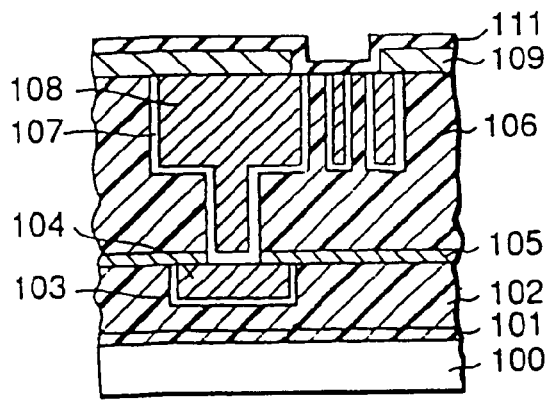
Figure 4C:
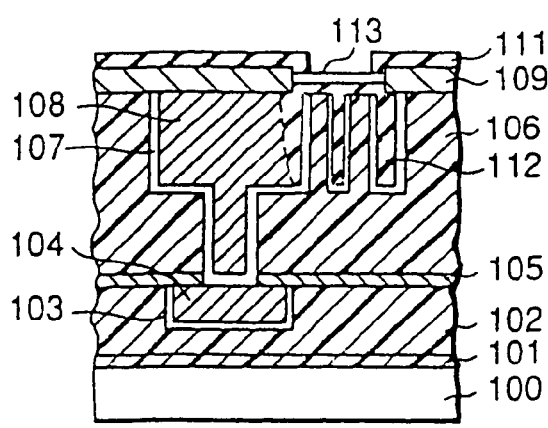
Figure 4D:
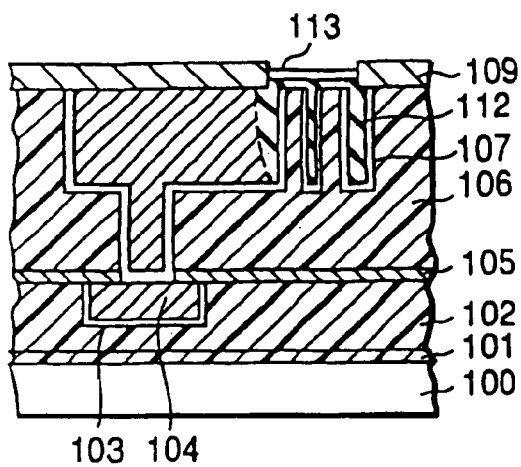
Figure 4E:
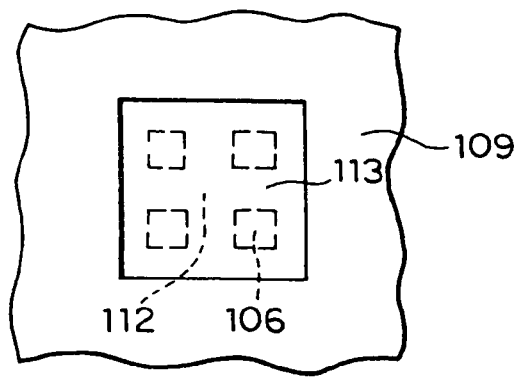
FIG. 4E is a top view showing a part of FIG. 4D.

The following method may be employed instead of the thermal treatment for restoring a prober mark, which is performed after the silicon wafer inspection process. The semiconductor device manufacturing process according to this method is shown in FIG. 4A to FIG. 4E as sectional diagrams indicating a direction of wiring extended on the wiring layer located on the top layer and having the pad electrode layer. FIG. 4A to FIG. 4D each correspond to FIG. 1A to FIG. 1D, and like reference numerals are used to indicate like component parts. FIG. 4E is a top view showing a part of FIG. 4D.

That is, a pillar-shaped insulating film (e.g., silicon oxide film 106) is previously intruded into the CuAl layer 112 (=pad electrode layer) in the opening 110 of the SiN film 109 (insulating protective film), and this pillar-shaped insulating film mechanically prevents the probing needle from reaching a deep point of the CuAl layer 112 (=pad electrode layer).

In this case, the probing needle, which is prevented from reaching a deep point by the formed insulating pillar, is contacted to the CuAl layer 112 (=pad electrode layer) to perform the inspection step as described above. Specifically, when the probing needle has reached a predetermined depth, its entry is physically prevented by the formed insulating film, so that the needle scratch is prevented from reaching the deep point. The pillar-shaped insulating film which is intruded into the CuAl layer 112 (=pad electrode layer) can be determined its quantity and arrangement as desired.

Second Embodiment

In this embodiment, Cu is used as a material for the wiring layer, and tantalum (Ta) is used as a metal whose oxidation tendency is higher (=easily oxidized) than Cu. Specifically, a tantalum (Ta) film is used in this embodiment instead of the AlCu film (or Al film) 111 used in the first embodiment.

The steps up to the formation of the opening in the SiN film (=insulating protective film) on the Cu wiring layer 108 described in the first embodiment (see FIG. 1A) can also be performed by the same procedure under the same conditions in this embodiment, so that the description about them is omitted. Therefore, like reference numerals are used for like component parts as those used in FIG. 1A to FIG. 1E of the first embodiment.

Now, this embodiment will be described with reference to FIG. 5A to FIG. 5C.

Figure 5A:
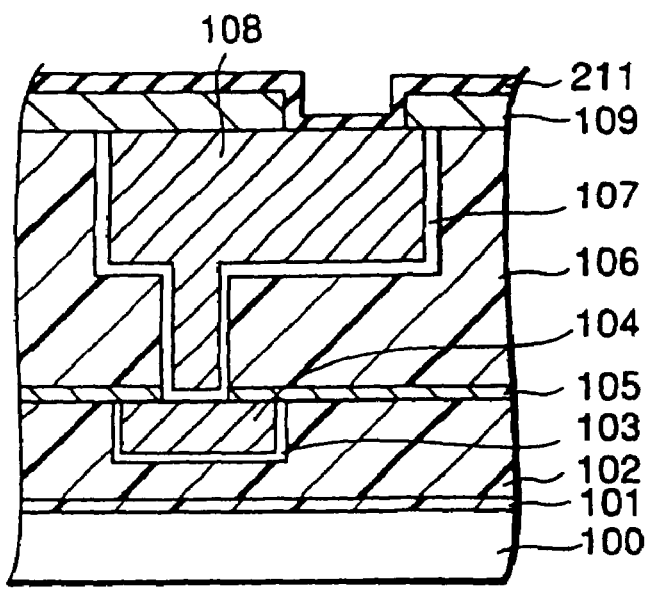
FIG. 5A, FIG. 5B and FIG. 5C are sectional diagrams showing a step of manufacturing a semiconductor device according to a second embodiment of the invention.
Figure 5B:
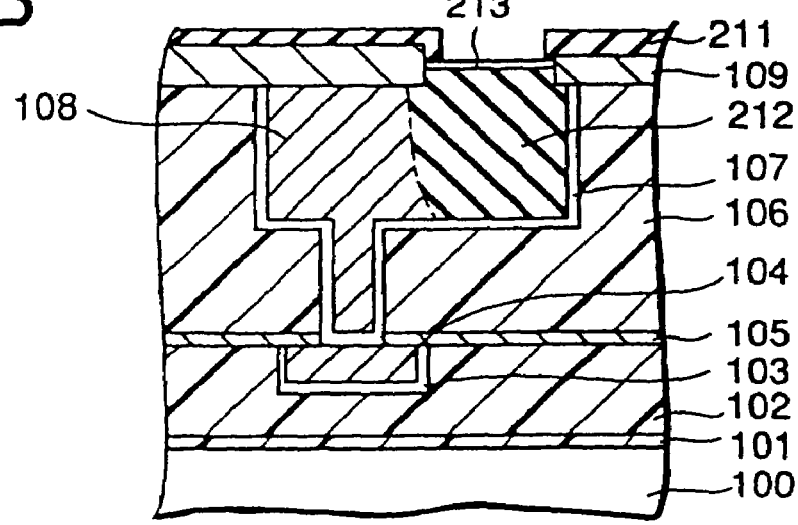
Figure 5C:
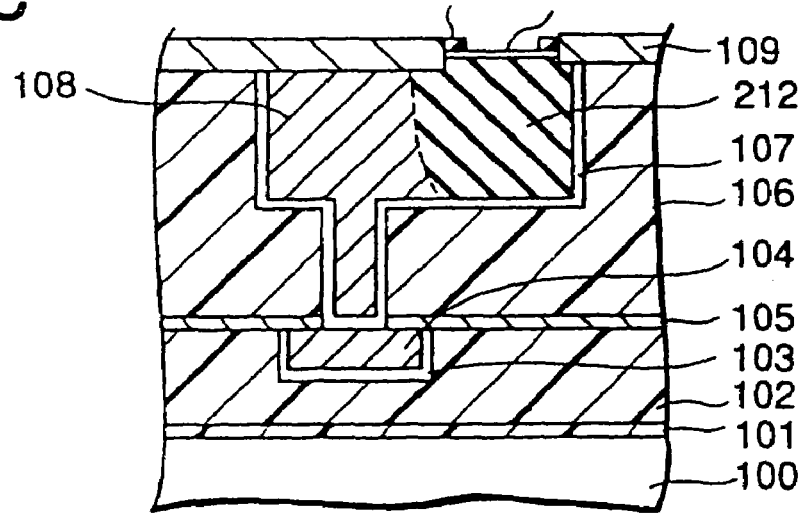

FIG. 5A to FIG. 5C show sectional diagrams showing a direction in which wiring is extended on the wiring layer having the pad electrode layer.

First, the SiN film 109 (=insulating protective film) is etched to form the opening so to partly reveal the Cu wiring layer 108.

Then, an existing heat sputtering method is used to form a tantalum (Ta) film 211 with a thickness of about 20 nm so to cover the Cu wiring layer 108 (=upper wiring layer) and the SiN film 109 (=insulating protective film) (the above step is shown in FIG. 5A).

First, the surface of the Cu wiring layer 108 is thermally treated with exposure to the hydrogen atmosphere to remove the natural oxide film from the surface. For example, the thermal treatment is performed at the partial pressure of hydrogen of 0.2 Pa and a temperature of 350° C. for about three minutes. Then, the tantalum (Ta) film 211 is formed with the silicon substrate 100 heated and kept at a temperature of about 350° C. (from 300° C. to 450° C.) by the sputtering technique. In the step of forming the tantalum (Ta) film 211, the heating treatment is performed, and when it is formed on the Cu wiring layer 108, the tantalum (Ta) film 211 reacts with the component of the Cu wiring layer 108 to form a CuTa layer 212, namely a pad electrode layer. At this time, an oxide layer 213 mainly comprising tantalum (Ta) is formed on the surface of the CuTa layer 212 (=pad electrode layer).

Here, the component of the tantalum (Ta) film 211 is diffused in the Cu wiring layer 108 to partly alloy the Cu wiring layer 108 in the heating process. At the same time, a reaction layer (=alloy layer) with the component of the Cu wiring layer 108 is formed in the tantalum (Ta) film 211. The CuTa layer 212 comprises the alloyed part to reach the bottom surface of the Cu wiring layer 108 and the reaction layer (=alloy layer) of the tantalum (Ta) film 211 and forms the pad electrode layer. (The above step is shown in FIG. 5B.)

The oxide layer 213 mainly comprising tantalum (Ta) acts as a protective layer having an oxidation resistant film or the like upon the CuTa layer 212 (=pad electrode layer).

In this step, an existing non-heat sputtering technique may be used. Specifically, the surface of the Cu wiring layer 108 is thermally treated with exposure to the hydrogen atmosphere to remove the natural oxide film formed on the surface. For example, the thermal treatment is performed at the partial pressure of hydrogen of 0.2 Pa and a temperature of 350° C. for about three minutes. Then, the tantalum (Ta) film 211 is formed with a thickness of about 20 nm to cover the Cu wiring layer 108 (=upper wiring layer) and the SiN film 109 (=insulating protective film) by the non-heat sputtering technique. Additionally, the thermal treatment is then performed in the atmosphere containing a very small amount of oxygen (partial pressure of oxygen of $1\times10^{-5}$ Pa or less) at a temperature of about 350° C.

Thus, the previous removal of the natural oxide film prevents the formation of an interface oxidation layer (see FIG. 2) on the CuTa layer 212. Therefore, after the tantalum (Ta) film 211 is formed on the Cu wiring layer 108 by the non-heat sputtering technique, the tantalum (Ta) component is promptly diffused in the Cu wiring layer 108 in the process of thermal treatment, and the thermal treating time after the non-heat sputtering can be reduced.

Then, the tantalum (Ta) film 211 is removed from the surface of the SiN film 109. For example, a chemical mechanical polishing (CMP) method is used to remove the tantalum (Ta) film 211 in this embodiment. Then, the CuTa layer 212 is present in the opening formed in the SiN film 109 and can be remained selectively because it is not removed by the CMP step (the above step is shown in FIG. 5C).

Then, the silicon wafer is carried into an inspection unit and inspected to judge whether each semiconductor chip is good or not by the same way as in the first embodiment.

Here, an auto prober and a probing card are contacted to the CuTa layer 212 (=pad electrode layer) so to judge the quality of each semiconductor chip.

Then, the silicon wafer is carried into a vacuum oven in the same way as in the first embodiment and thermally treated again with an atmosphere of the partial pressure of oxygen of $1\times10^{-5}$ Pa or less supplied at a temperature of 350° C. for about 15 minutes. Thus, an oxide layer mainly comprising tantalum (Ta) is formed again on the mark, which is caused on the CuTa layer 212 (=pad electrode layer) by the probing needle, by the thermal treatment.

When the tantalum (Ta) film 211 is thinner than the required thickness, the tantalum (Ta) component is short in quantity, so that it is impossible to form an oxide layer mainly comprising tantalum (Ta) again to protect the CuTa layer 212 (pad electrode layer).

Then, an existing bonding step is conducted using a metal wire or conductive bump as a conductive substance in the same way as in the first embodiment.

Here, there is undergone the existing bonding step to the CuTa layer 212 in order to electrically connect the Cu wiring layer 108 and the conductive outside substance (e.g., package bonding pad) in the atmosphere. For example, an existing bonding tool is used to directly connect a metal wire (e.g., gold (Au)) as the conductive substance to the CuTa layer 212 under heading and application of a pressure. In the process of performing the bonding step, the oxide layer 213 mainly comprising tantalum (Ta) on the surface of the CuTa layer 212 is partly penetrated to reveal the CuTa layer 212, and an alloy composition is produced on the junction between the revealed portion and the wire to form a mechanically and electrically connected state.

The conductive wire and the conductive bump are formed of metal such as gold (Au), aluminum (Al), lead (Pb), tin (Sn), indium (In), gallium (Ga), bismuth (Bi), antimony (Sb), silver (Ag) and the like used alone or an alloy containing such metals.

After the bonding step is performed according to the above procedure, a high temperature storage test was performed at a temperature of 200° C. for about 2,000 hours. As a result, it was found that the bonding resistance of the CuTa layer 212 (=pad electrode layer) did not rise, and the same good bonding state was kept in the same way as in the first embodiment. The tantalum (Ta) concentration in the surface layer of the CuTa layer 212 was examined in the same way as in the first embodiment, and it was found that the tantalum (Ta) concentration contained in the surface layer of the CuTa layer 212 was desired to be 2 atm % or more.

The surface layer used in this embodiment means a layer ranging from the surface to a depth of about 50 nm.

When the Cu wiring layer 108 has a thickness of about 1.2 µm the tantalum (Ta) film 211 may be determined to be 10 nm or more to 100 nm or less because of the same reason as in the first embodiment. That is, when the thickness of the tantalum (Ta) film 211 has the upper limit of about 10% at a ratio with respect to the thickness of the Cu wiring layer 108, the increase of the resistance value of the CuTa layer 212 (=pad electrode layer) and the processing time by the CMP method can be suppressed.

In addition, the pad electrode layer can be formed in this embodiment without removing the natural oxide film from the surface of the Cu wiring layer 108 (=upper wiring layer) in the same way as in the first embodiment. In this case, the pad electrode layer may be formed by processing according to the procedure shown in the first embodiment. As a result, the tantalum (Ta) concentration contained in the CuTa layer 212 is kept at a low level, and the resistance value of the CuTa layer 212 can be prevented from increasing.

By configuring the pad electrode layer by the alloyed layer as in this embodiment, it has a sufficient resistance to oxidation and a strength for a prolonged use, and the reliability of not only the Cu wiring layer but also the semiconductor device can be enhanced.

Third Embodiment

In this embodiment, Cu is used as a material for the wiring layer, and titanium (Ti) is used as a metal whose oxidation tendency is higher (=readily oxidized) than Cu. Specifically, a titanium (Ti) film is used in this embodiment instead of the AlCu film (or Al film) 111, which is used in the first embodiment.

In this embodiment, the steps up to the formation of the opening in the SiN film 109 (=insulating protective film) on the Cu wiring layer 108 described in the first embodiment can be performed under the same condition by the same procedure, so that its description is omitted (See FIG. 1A). Therefore, like reference numerals are used to indicate like components as those shown in FIG. 1A to FIG. 1E of the first embodiment.

This embodiment will be described with reference to FIG. 6A to FIG. 6C.

Figure 6A:
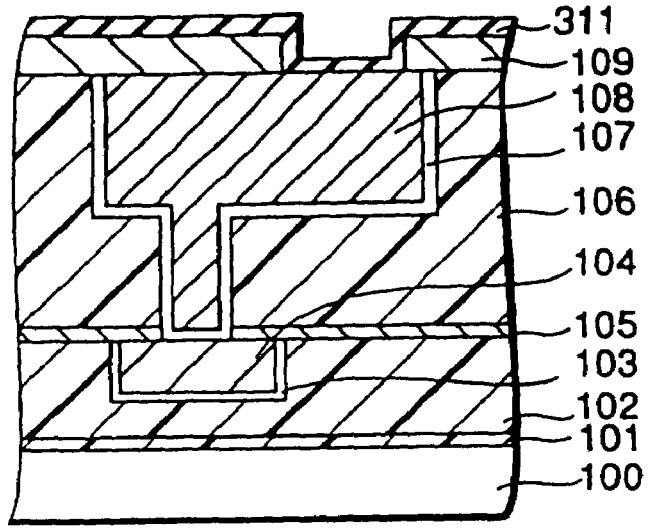
FIG. 6A, FIG. 6B and FIG. 6C are sectional diagrams showing a step of manufacturing a semiconductor device according to a third embodiment of the invention.
Figure 6B:
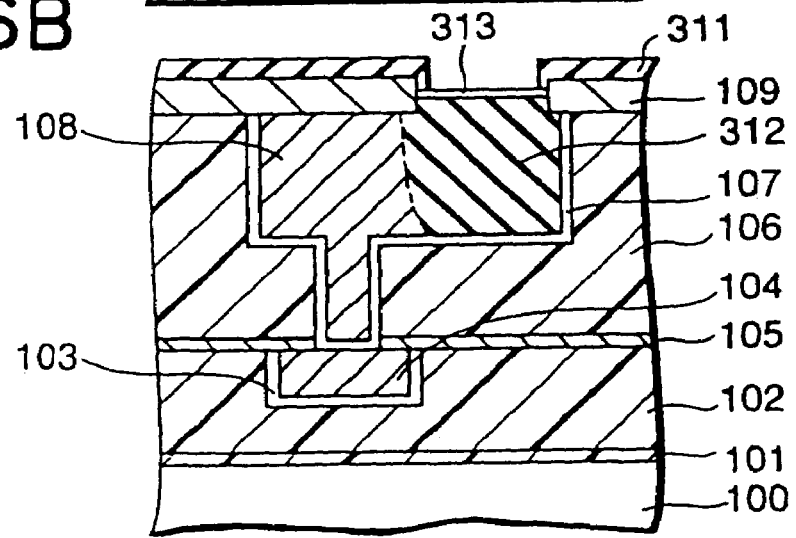
Figure 6C:
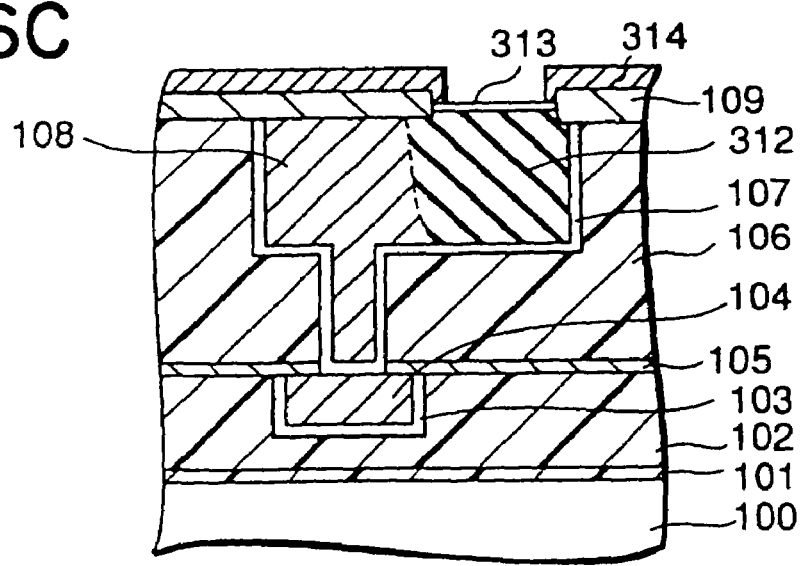

FIG. 6A to FIG. 6C show sectional diagrams showing a direction in which wiring extends on the wiring layer which is on the top layer and has a pad electrode layer.

First, the SiN film 109 (=insulating protective film) is etched to form the opening to partly reveal the Cu wiring layer 108 in the same way as in the first embodiment.

Then, the surface of the Cu wiring layer 108 is thermally treated with exposure to an atmosphere of hydrogen to remove the natural oxide film formed on the surface. Here, the thermal treatment is performed under conditions, for example, a partial pressure of hydrogen of 0.2 Pa and a temperature of 350° C., for about three minutes. Then, an existing non-heat sputtering technique is employed to form a titanium (Ti) film 311 with a thickness of about 20 nm to cover the Cu wiring layer 108 and the SiN film 109 (=insulating protective film). (The above step is shown in FIG. 6A.)

Then, the silicon wafer is taken out from the sputtering device and thermally treated in a vacuum (specifically, an atmosphere with a partial pressure of oxygen of $1\times10^{-5}$ Pa or less) at a temperature of 400° C. for about 30 minutes.

The thermal treatment makes the titanium (Ti) film 311 (on the Cu wiring layer 108) react with the Cu wiring layer 108 to form a CuTi layer 312, namely the pad electrode layer. Additionally, an oxide layer 313 mainly comprising titanium (Ti) is formed on the surface layer of the CuTi layer 312 (=pad electrode layer 108).

Here, the component of the titanium (Ti) film 311 is diffused in the Cu wiring layer 108 to partly alloy the Cu wiring layer 108 in the process of thermal treatment. Additionally, a reaction layer (=alloy layer) with the component of the Cu wiring layer 108 is formed in the titanium (Ti) film 311. The CuTi layer 312 is formed of the alloyed part extended to the bottom surface of the Cu wiring layer 108 and the reaction layer (=alloy layer) of the titanium (Ti) film 311 and configures the pad electrode layer. (The above step is shown in FIG. 6B.)

This process can also be performed by an existing heat sputtering technique. In this case, the surface of the Cu wiring layer 108 is thermally treated by exposing to, for example, an atmosphere of hydrogen to remove the natural oxide film formed on the surface. Here, the thermal treatment is performed under conditions of, for example, a partial pressure of hydrogen of 0.2 Pa and a temperature of 350° C., for about three minutes.

Thus, the previous removal of the natural oxide film prevents the formation of an interface oxide layer (see FIG. 2) on the CuTi layer 312. Therefore, the titanium (Ti) element is diffused to reach the inside of the Cu wiring layer 108 in the process of forming the titanium (Ti) film 311 on the Cu wiring layer 108 by the heat sputtering technique.

Specifically, the silicon substrate 100 is heated to and kept at a temperature of about 400° C., and the titanium (Ti) film 311 is formed with a thickness of about 20 nm to cover the Cu wiring layer 108 (=upper wiring layer) and SiN film 109 (=insulating protective film) by the sputtering technique. In this case, the titanium (Ti) film 311 formed on the Cu wiring layer 108 reacts with the component of the Cu wiring layer 108 to form a CuTi layer 312, namely the pad electrode layer, and an oxide layer 313 mainly comprising titanium (Ti) is formed on the surface layer of the CuTi layer 312.

The oxide layer 313 mainly comprising titanium (Ti) acts as a protective layer having resistance to oxidation upon the CuTi layer 312 (=pad electrode layer).

Then, the silicon wafer is carried into an asher device. Here, an oxygen radical (O*) is supplied to the surface of the silicon wafer to oxidize the periphery of the CuTi layer 312 (=pad electrode layer), namely the titanium (Ti) film 311 on the SiN film 109 (=insulating protective film), to form a titanium oxide (Ti) layer 314 (the above step is shown in FIG. 6C). Thus, electrical insulation is secured between the respective CuTi layers 312 (=pad electrode layers).

Then, the silicon wafer is carried into an inspection device, and the inspection step is performed to judge whether each semiconductor chip is good or not in the same way as in the first embodiment.

Then, the silicon wafer is carried into a vacuum oven and thermally treated at a temperature of 400° C. with an atmosphere of a partial pressure of oxygen of $1\times10^{-5}$ Pa or less supplied for about 15 minutes in the same way as in the first embodiment. This thermal treatment forms an oxide layer mainly comprising titanium (Ti) again on the mark caused on the CuTi layer 312 (=pad electrode layer) by the probing needle.

When the titanium (Ti) film 311 has a thickness smaller than required, the titanium (Ti) component is insufficient in amount, and the oxide layer mainly comprising titanium (Ti) cannot be formed again, and the CuTi layer 312 (=pad electrode layer) cannot be protected.

Then, an existing bonding step is performed using a metal wire or conductive bump as the conductive substance in the same way as in the first embodiment.

Here, the existing bonding step is given to the CuTi layer 312 in order to electrically connect the Cu wiring layer 108 and an outside conductive substance (e.g., package bonding pad) in the atmosphere. For example, a metal wire (e.g., gold (Au)) is used as a conductive substance and directly connected to the CuTi layer 312 under heating and pressure by an existing bonding tool.

In the process of performing this bonding step, the oxide layer 313 mainly comprising titanium (Ti) on the surface layer of the CuTi layer 312 is partly penetrated to reveal the CuTi layer 312, and the alloy composition is produced on the junction between the revealed part and the wire. Thus, the mechanically and electrically connected state is established.

The conductive wire and the conductive bump are formed of metal such as gold (Au), aluminum (Al), lead (Pb), tin (Sn), indium (In), gallium (Ga), bismuth (Bi), antimony (Sb) and silver (Ag) used alone or an alloy containing them.

Here, the bonding strength (=shear strength) of the wire bonding was measured to find that it had a tendency to become little lower than the usual strength. It is because an oxygen radical (O*) is supplied to the surface layer of the CuTi layer 312 in the process of forming the titanium oxide (Ti) layer 314. Specifically, the oxide radical (O*) acts on the oxide layer 313 mainly comprising titanium (Ti) in the process of oxidizing the titanium (Ti) film 311 on the SiN film 109 (=insulating protective film) to increase its thickness more than required, and a sufficient bonding strength (=shear strength) between the wire and the CuTi layer 312 cannot be obtained even if bonding is performed under the usual conditions.

Therefore, as an example, in the state that the wire bonding of the CuTi layer 312 (=pad electrode layer) was performed, the thermal treatment was performed in an oven set to a temperature of about 200° C. for about two hours in this embodiment. As a result, the bonding strength (=shear strength) of bonding was increased, and an adequate bonding state was obtained.

It is because the bonding area was increased by the thermal treatment of the oxide layer 313 mainly comprising titanium (Ti) having a thickness increased more than necessary, so that the component of the oxide layer 313 mainly comprising titanium (Ti) is diffused to join.

It is also possible to obtain a sufficient bonding strength (=shear strength) of bonding by adjusting the bonding conditions according to the thickness of the oxide layer.

After the bonding step was performed according to the above procedure, a high temperature storage test was performed at a temperature of 200° C. for about 2,000 hours. As a result, it was found that a bonding resistance of the CuTi layer 312 (=pad electrode layer) did not increase, and a good bonding condition was kept in the same way as in the first embodiment.

The titanium (Ti) concentration in the surface layer of the CuTi film 312 was examined in the same way as in the first embodiment, and it was found that the titanium (Ti) concentration contained in the surface layer of the CuTi layer 312 was desired to be 2 atm % or more for the bonding.

The surface layer in this embodiment is a layer from the surface to a depth of about 50 nm.

For the same reason as in the first embodiment, the titanium (Ti) film 311 may have a limit thickness of 10 nm or more to about 100 nm when the Cu wiring layer 108 has a thickness of about 1.2 μm. Specifically, when the thickness of the titanium (Ti) film 311 is determined to have an upper limit of about 10% at a ratio to the thickness of the CuTi layer 312 (=pad electrode layer), it is possible to prevent the increase of the resistance value of the CuTi layer 312 (=pad electrode layer) and the treating time.

In addition, this embodiment can form the pad electrode layer without removing the natural oxide film on the surface of the Cu wiring layer 108 (=upper wiring layer) in the same way as in the first embodiment. In this case, the pad electrode layer may be formed by treating according to the procedure shown in the first embodiment. As a result, the titanium (Ti) concentration contained in the CuTi layer 312 is kept at a low value, and it is possible to prevent the resistance value of the CuTi layer 312 from increasing.

Thus, when the pad electrode layer is formed of the alloy layer as in this embodiment, the reliability of not only the Cu wiring layer but also the semiconductor device having a sufficient resistance to oxidation and a strength for prolonged use can be enhanced.

Fourth Embodiment

In this embodiment, Cu is used as a material for the wiring layer and aluminum (Al) is used as a metal whose oxidation tendency is higher (=readily oxidized) than Cu in the same way as in the first embodiment. This embodiment uses the AlCu film (or Al film) 111 in the same way as in the first embodiment and a laser beam as heating means in a process of the thermal treatment.

The steps up to the formation of the opening in the SiN film 109 (=insulating protective film) on the Cu wiring layer 108 described in the first embodiment (see FIG. 1A) can be performed under the same condition by the same procedure in this embodiment, so that its description is omitted. Therefore, like reference numerals are used to indicate like components as those shown in FIG. 1A to FIG. 1E of the first embodiment.

This embodiment will be described with reference to FIG. 7A to FIG. 7C.

Figure 7A:
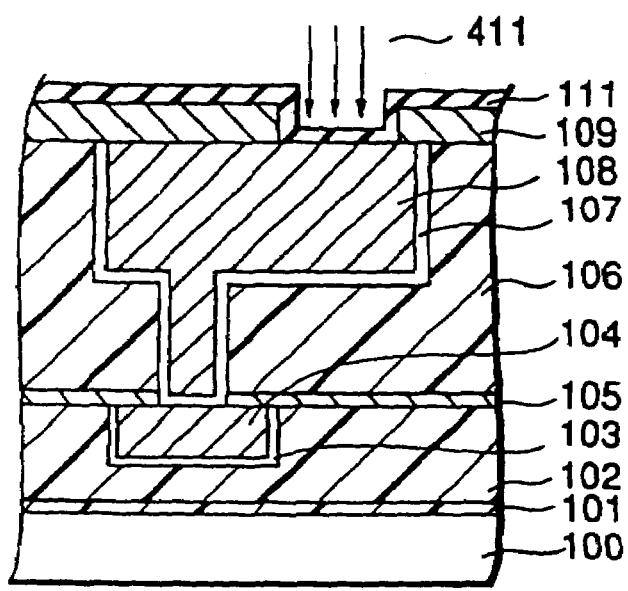
FIG. 7A, FIG. 7B and FIG. 7C are sectional diagrams showing a step of manufacturing a semiconductor device according to a fourth embodiment of the invention.
Figure 7B:
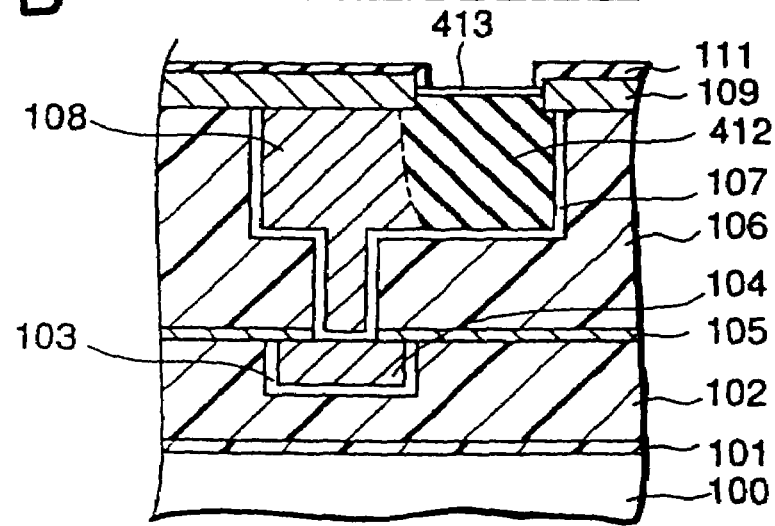
Figure 7C:
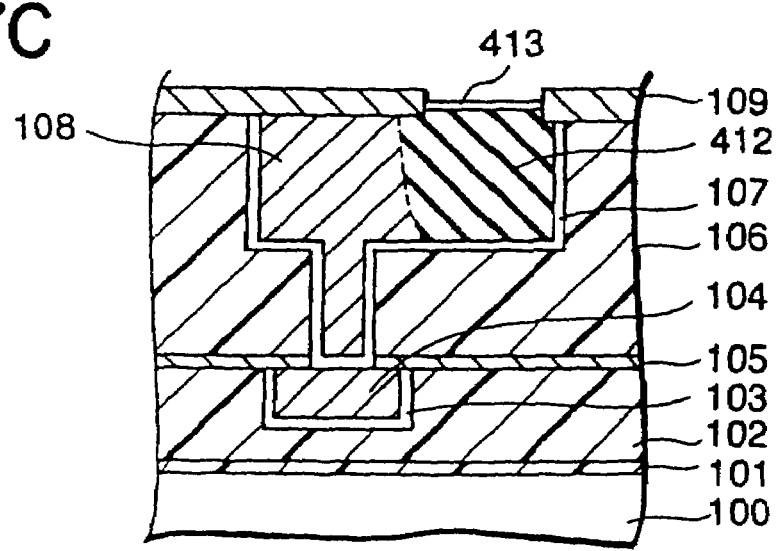

FIG. 7A to FIG. 7C show sectional diagrams showing a direction in which wiring extends on the wiring layer which is on the top layer and has a pad electrode layer.

An existing non-heat sputtering technique is used to form the AlCu film 111, which mainly comprising aluminum (Al) and contains 0.5 wt % of Cu, with a thickness of about 20 nm to cover the Cu wiring layer 108 (=upper wiring) and the SiN film 109 (=insulating protective film) (the above process is shown in FIG. 7A).

Then, the silicon wafer is taken out of the sputtering device, and a laser beam 411 is irradiated to only the AlCu film 111 on the Cu wiring layer 108. At this time, the laser beam 411 is determined to have energy of about 1 J/cm².

This thermal treatment makes the AlCu film 111 on the Cu wiring layer 108 react with the component of the Cu wiring layer 108 to form a CuAl layer 412, namely the pad electrode layer. At this time, an oxide layer 413 mainly comprising aluminum is formed on the surface layer of the CuAl layer 412 (=pad electrode layer).

Here, in the process of thermal treatment, the alloy components of aluminum and copper of the AlCu film 111 are diffused in the Cu wiring layer 108 to partly alloy the Cu wiring layer 108. At this time, a reaction layer (=alloy layer) with the component of the Cu wiring layer 108 is formed in the AlCu film 111. The CuAl layer 412 is formed of the alloyed part extended to the bottom surface of the Cu wiring layer 108 and a reaction layer (=alloy layer) of the AlCu film 111 and forms the pad electrode layer.

Thus, the irradiation of the laser beam 411 intensively gives heat and energy to react the AlCu film 111 on the Cu wiring layer 108 with the Cu wiring layer 108 so to form the CuAl layer 412, namely the pad electrode layer. At this time, the oxide layer 413 mainly comprising aluminum is formed on the surface layer of the CuAl layer 412 (the above process is shown in FIG. 7B).

The use of the laser beam as the heating means greatly promotes the diffusion and reaction of the respective components of the Cu wiring layer 108 and the AlCu film 111, and the time required for the thermal treatment in the process of forming the CuAl layer 412 (=pad electrode layer) and the oxide layer 413 mainly comprising aluminum can be decreased greatly. At this time, the portion not irradiated with the laser beam and not on the Cu wiring layer 108 is in the sate of the AlCu film 111.

Even when the natural oxide film is formed on the surface of the Cu wiring layer 108, the irradiation of the laser beam 411 quickly heats the AlCu film 111 to sufficiently accelerate the diffusion of the components and the reaction with the Cu wiring layer 108. Thus, the effect in connection with the formation of the pad electrode layer is not variable depending whether the natural oxide film is removed or not. Therefore, the treatment of the natural oxide film, namely its removal or not, is not particularly limited in this embodiment.

The oxide layer 413 mainly comprising aluminum acts as a protective layer having resistance to oxidation and the like upon the CuAl layer 412 (=pad electrode layer).

Then, the silicon wafer is carried to a carrier, immersed in phosphoric acid in an etching bath to perform wet etching, thereby dissolving to remove the AlCu film 111 on the SiN film 109 (=insulating protective film). At this time, the CuAl layer 412 (=pad electrode layer) is resistant to dissolution and can be selectively remained (the above step is shown in FIG. 7C).

The wet etching is performed for about four minutes.

In addition to phosphoric acid, diluted hydrochloric acid (HCl) or diluted hydrofluoric acid (HF) can also be used. Specifically, diluted hydrofluoric acid (HF), diluted hydrochloric acid (HCl) or phosphoric acid can be solely used on the surface of the silicon substrate 100 or the wet etching with each of them can be combined. For example, the AlCu film 111 on the SiN film 109 can be dissolved for removed by supplying diluted hydrofluoric acid (HF) or phosphoric acid, then diluted hydrochloric acid (HCl).

An existing wire bonding step was given to the CuAl layer 412 (=pad electrode layer) formed as described above in the atmosphere. Here, a metal wire (e.g., gold (Au)) was directly bonded to the CuAl layer 412 (=pad electrode layer) under heating and pressure according to the procedure and conditions described in the first embodiment for conduction of electricity between the Cu wiring layer 108 and the conductive outside substance (e.g., package bonding pad). As a result, the same good bonding properties were observed as in the first embodiment.

A high-temperature storage test was performed at a temperature of 200° C. for about 2,000 hours. As a result, it was found that a bonding resistance of the CuAl layer 412 (=pad electrode layer) did not increase and a good bonding state was kept. It was apparent from the result that the Al concentration contained in the surface layer of the CuAl layer 412 (=pad electrode layer) is desired to be 2 atm % or more for the bonding.

In this embodiment, the surface layer is a layer ranging from the surface to a depth of about 50 nm.

For the same reason as in the first embodiment, the AlCu film 111 may have a thickness of about 10 nm or more to about 100 nm or less when the Cu wiring layer 108 has a thickness of about 1.2 μm. Specifically, when the AlCu film 111 has a thickness whose upper limit is about 10% at a ratio to the thickness of the Cu wiring layer 108, the resistance value of the CuAl layer 412 (=pad electrode layer) is prevented from increasing, and the treating time and the like can be suppressed.

Thus, when the pad electrode layer is formed of an alloyed layer as in this embodiment, its resistance to oxidation and strength are sufficient to the prolonged use, and the reliability of not only the Cu wiring layer but also the semiconductor device can be enhanced.

Fifth Embodiment

In this embodiment, Cu is used as a material for the wiring layer and aluminum (Al) is used as a metal whose oxidation tendency is higher (readily oxidized) than Cu in the same way as in the first embodiment. In this embodiment, for example, an oxidation resistant film (=the oxide layer 113 mainly comprising aluminum) on the surface layer of the CuAl layer 112 is formed in the same way as in the first embodiment. Then, a mask pattern is formed on the CuAl layer 112 (=pad electrode layer) to protect the oxidation resistant film (=the oxide layer 113 mainly comprising aluminum), the wet etching is performed to remove the AlCu film 111 on the SiN film 109 (=insulating protective film), namely in the region other than the CuAl layer 112 (=pad electrode layer).

Specifically, this embodiment will be described with reference to FIG. 8A and FIG. 8B.

Figure 8A:
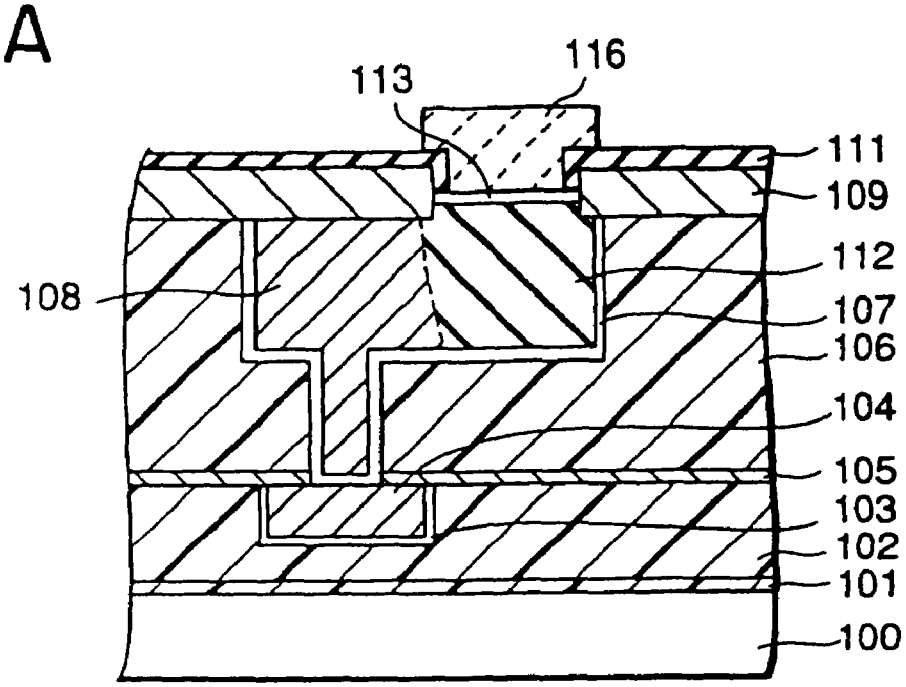
FIG. 8A and FIG. 8B are sectional diagrams showing a step of manufacturing a semiconductor device according to a fifth embodiment of the invention.
Figure 8B:
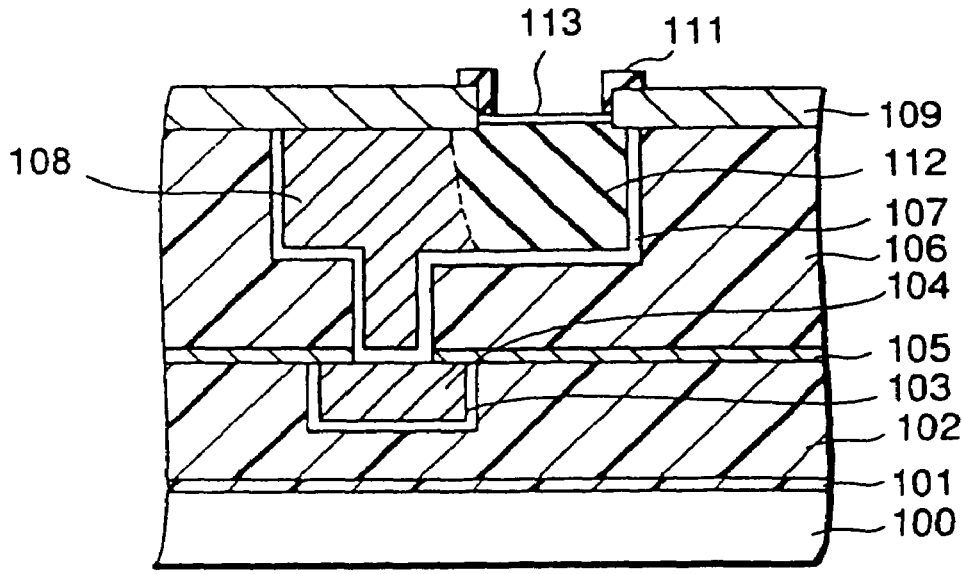

FIG. 8A and FIG. 8B show sectional diagrams of a direction in which wiring of the wiring layer, which is on the top layer and has the pad electrode layer, extends.

In this embodiment, the AlCu film (or Al film) 111 is used in the same way as in the first embodiment. The steps up to the formation of the opening in the SiN film 109 (=insulating protective film) on the Cu wiring layer (=pad electrode layer) described in the first embodiment (see FIG. 1A) can be performed under the same condition by the same procedure in this embodiment, so that its description is omitted. Additionally, like reference numerals are used to indicate like components as those shown in FIG. 1A to FIG. 1E of the first embodiment.

The CuAl layer 112 (=pad electrode layer) and the oxide layer 113 mainly comprising aluminum are formed in the same way as in the first embodiment, then the resist pattern 116 is formed on the CuAl layer 112 (=pad electrode layer) (the above step is shown in FIG. 8A).

Here, the resist pattern 116 can be formed by, for example, a lithography technology after a photoresist is applied so that the CuAl layer 112 (=pad electrode layer) is protected.

Then, the resist pattern 116 is used as a mask, and the wet etching is performed to remove the AlCu film 111 on the SiN film 109 (=insulating protective film). Then, the resist pattern 116 is removed by ashing performed by an existing method (the above step is shown in FIG. 8B). Here, the wet etching can be performed using diluted hydrofluoric acid (HF), phosphoric acid or diluted hydrochloric acid (HCl) according to the procedure described in the first embodiment.

Then, the inspection and bonding steps are sequentially performed according to the same procedure and conditions as in the first embodiment.

The methods described in the first and fourth embodiments need to set the concentration of the etching solution and the time required for etching to an adequate level in order to remove the unnecessary AlCu film 111 on the SiN film 109 (=insulating protective film). Therefore, when the wet etching is performed to remove the unnecessary AlCu film 111, etching acts upon the CuAl layer 112 (=pad electrode layer) and the oxide layer 113 mainly comprising aluminum.

In this embodiment, the CuAl layer 112 (=pad electrode layer) and the oxide layer 113 mainly comprising aluminum are protected by the resist pattern 116 in the process of wet etching. Therefore, there is hardly necessity for considering an affect upon the CuAl layer 112 (=pad electrode layer) and the oxide layer 113 mainly comprising aluminum by etching in the process of removing the AlCu film 111.

Therefore, so-called flexibility of the process increases in the process of removing the unnecessary AlCu film 111 after the wet etching.

This embodiment provides the same effect by using tantalum (Ta) used in the second embodiment or titanium (Ti) used in the third embodiment in stead of Al.

When the pad electrode layer is formed of an alloyed layer as in this embodiment, its resistance to oxidation and strength are sufficient for the prolonged use, and the reliability of not only the Cu wiring layer but also the semiconductor device can be enhanced.

Sixth Embodiment

In this embodiment, Cu is used as a material for the wiring layer and aluminum (Al) is used as a metal whose oxidation tendency is higher (readily oxidized) than Cu in the same way as in the first embodiment. In this embodiment, the unnecessary AlCu film 111 on the SiN film 109 is removed by wet etching after the inspection process and the bonding process.

This embodiment will be described specifically with reference to FIG. 9A and FIG. 9B.

Figure 9A:
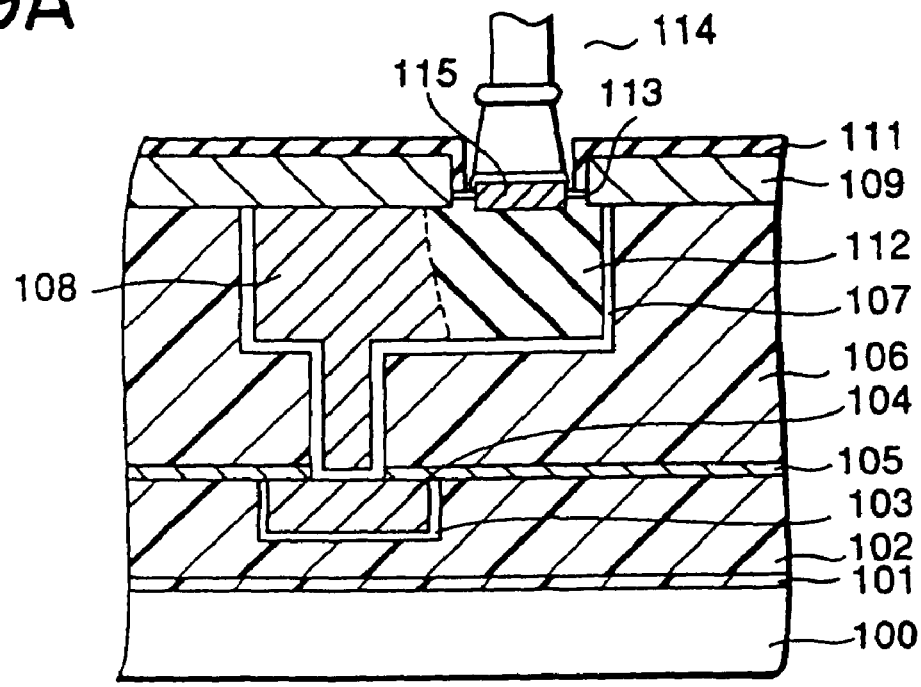
FIG. 9A and FIG. 9B are sectional diagrams showing a step of manufacturing a semiconductor device according to a sixth embodiment of the invention.
Figure 9B:
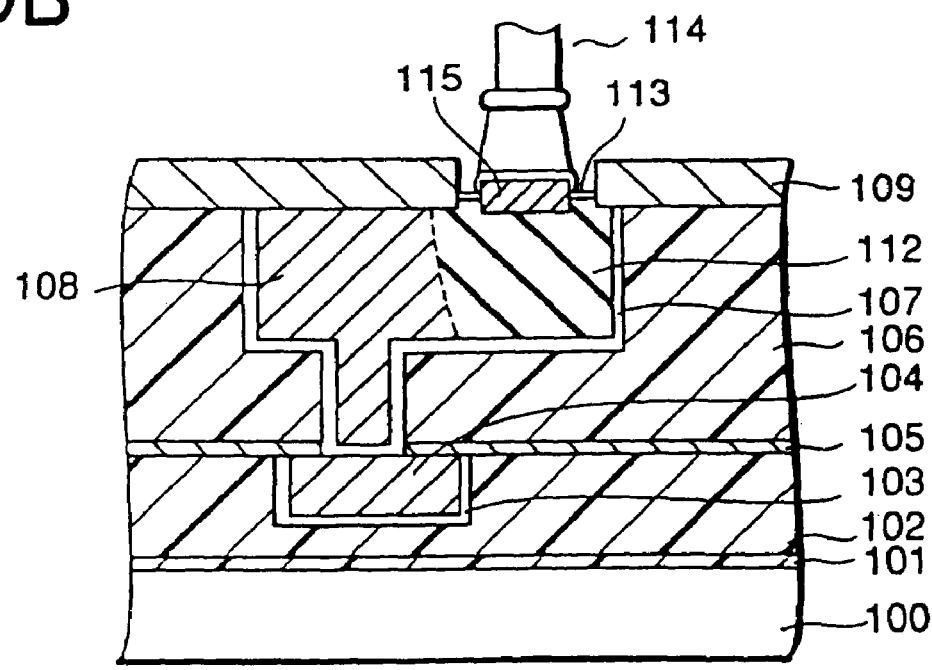

FIG. 9A and FIG. 9B show sectional diagram of a direction in which wiring of the wiring layer, which is on the top layer and has the pad electrode layer, extends.

In this embodiment, for example, the AlCu film (or Al film) 111 is used in the same way as in the first embodiment. This embodiment can be performed according to the same conditions and the same procedure up to the step (see FIG. 1A) of forming the opening in the SiN film 109 (=insulating protective film) on the Cu wiring layer 108 described in the first embodiment, so that its description will be omitted. Additionally, like reference numerals are used to indicate like components as those shown in FIG. 1A to FIG. 1E of the first embodiment.

In this embodiment, the CuAl layer 112 (=pad electrode layer) and the oxide layer 113 mainly comprising aluminum are formed in the same way as in the first embodiment, to perform bonding without removing the AlCu film (or the Al film) 111 by etching so to make bonding of a conductive wire (e.g., gold (Au)) or conductive bump to the CuAl layer 112 (=pad electrode layer). Here, the metal wire 114 is directly connected to the CuAl layer 112 (=pad electrode layer) by bonding under heating and pressure in the same way as in the first embodiment.

When the bonding of the CuAl layer 112 (=pad electrode layer) and the metal wire 114 (or conductive bump) is performed, the oxide layer mainly comprising aluminum of the surface layer is partly penetrated to reveal the CuAl layer 112 (=pad electrode layer), and the alloy composition 115 is formed on the junction thereof in the process in which the mutual materials are reacted. The mechanical and electrical connection of the bonding is established by the alloy composition 115. Additionally, the CuAl layer 112 (=pad electrode layer) is protected by the oxide layer 113 mainly consisting aluminum which is on the region other than the bonding junction portion (the above step is shown in FIG. 9A).

Then, the AlCu film 111 on the SiN film 109 (=insulating protective film) is removed by the wet etching with the wire or bump connected to the CuAl layer 112 (=pad electrode layer) (the above step is shown in FIG. 9B). Here, the wet etching can be performed according to the procedure and conditions described in the first embodiment using diluted hydrofluoric acid (HF), phosphoric acid or diluted hydrochloric acid (HCl).

To remove the unnecessary AlCu film 111 on the SiN film 109, the concentration of the etching solution or the processing time required for etching is determined to an adequate level. Therefore, when the wet etching is performed to remove the unnecessary AlCu film 111 before the bonding, etching acts upon the CuAl layer 112 (=pad electrode layer) and the oxide layer 113 mainly comprising aluminum.

Accordingly, by removing the unnecessary AlCu film 111 after the bonding connection as shown in this embodiment, an effect by the wet etching on the CuAl layer 112 (pad electrode layer) and the oxide layer 113 mainly comprising aluminum can be suppressed.

In this embodiment, the CuAl layer 112 (=pad electrode layer) and the oxide layer 113 mainly comprising aluminum are protected without requiring the step of forming a mask pattern, and the unnecessary AlCu film 111 on the SiN film 109 (=insulating protective film) can be removed. At this time, the wet etching can be performed without considering an effect of a difference in etching rate or the like, and a so-called flexibility of the process increases in the process of removing the AlCu film 111.

Thus, when the pad electrode layer is formed of the alloyed layer as in this embodiment, its resistance to oxidation and strength is sufficient to the prolonged use, and the reliability of not only the Cu wiring layer but also the semiconductor device can be enhanced.

In this embodiment, the same effect can also be obtained by using tantalum (Ta) used in the second embodiment or titanium (Ti) used in the third embodiment instead of Al.

In the first to sixth embodiments described above, aluminum (Al), titanium (Ti) and tantalum (Ta) were used as a metal whose oxidation tendency is higher (readily oxidized) than Cu, and the same effects can be obtained by using zirconium (Zr), vanadium (V), tin (Sn), tungsten (W), cobalt (Co), iron (Fe), nickel (Ni), ruthenium (Ru), chrome (Cr), molybdenum (Mo), niobium (Nb), hafnium (Hf), magnesium (Mg) and beryllium (Be).

When any of such metal materials is used in the respective embodiments, a film of a single material or a film of an alloy is formed on the Cu wiring layer 108 and the SiN film 109 (=insulating protective film). Then, it is reacted with the Cu wiring layer 108 by processing according to the procedure and conditions described in the respective embodiments to form an alloy layer (=pad electrode layer) with Cu having the oxide layer on the surface layer. Then, the unnecessary film on the SiN film 109 (=insulating protective film) is removed by the wet etching process, the CMP method, or the like, and the alloy layer may be used as the pad electrode layer for bonding connection.

Here, a relation between the copper concentration in and just below the surface (a depth of about 0-4 nm) of the pad electrode layer including the surface oxide layer and a strength of bonding will be explained. FIG. 10 is a diagram showing the result of a shear test, which was conducted after forming a pad electrode layer including a surface oxide layer and then bonding, in comparison with the result of a shear test, which was conducted after forming a pad electrode layer including a surface oxide layer, performing an acid treatment (e.g., a carbonic acid treatment) of the surface and bonding. They are, as explained later, different in a concentration of copper in and just below the surface (a depth of about 0-4 nm, and especially a depth of about 0-2 nm) of the pad electrode layer including the surface oxide layer.

It is apparent from FIG. 10 that the result of the shear test, which was conducted after forming the pad electrode layer including the surface oxide layer, performing the acid treatment of the surface and bonding, shows a significant improvement.

Figure 11A:
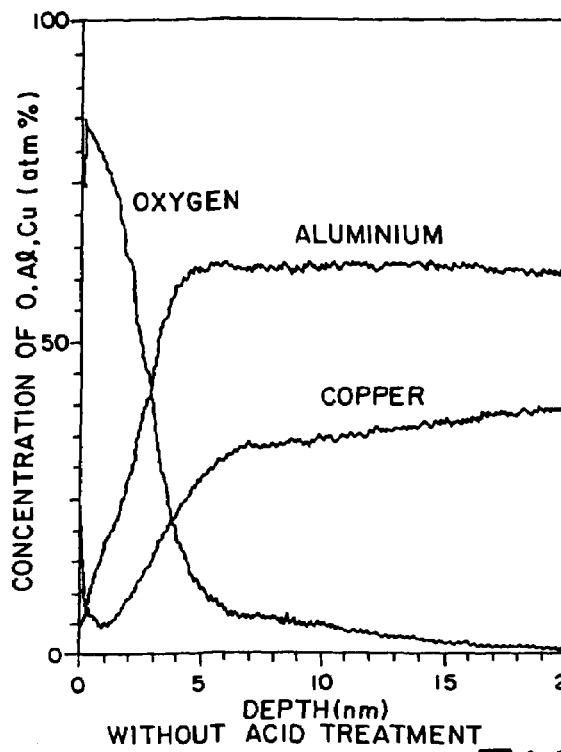
FIG. 11A, FIG. 11B and FIG. 11C are diagrams showing the results of analysis on the surface layer of the pad electrode layer including the surface oxide layer by a secondary ion mass spectroscopy.
Figure 11B:
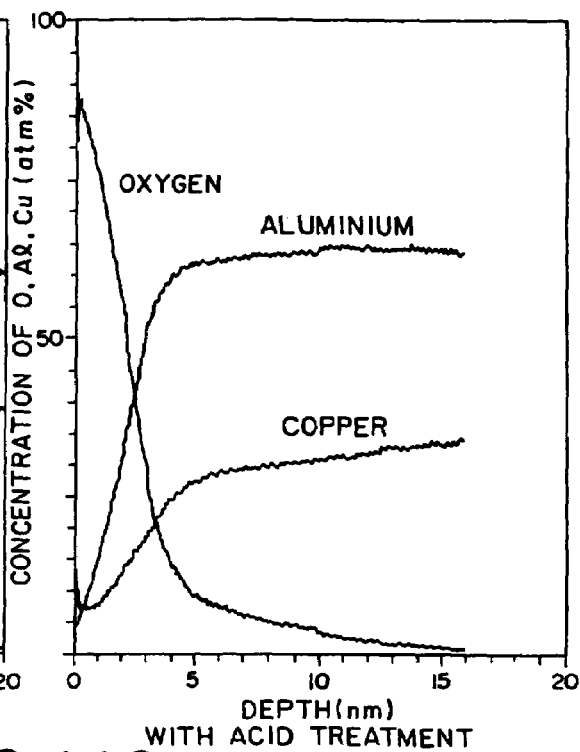

FIG. 11A is an example of the result obtained by forming the pad electrode layer including the surface oxide layer and analyzing its surface by the secondary ion mass spectroscopy (SIMS). FIG. 11B is an example of the result obtained by forming the pad electrode layer including the surface oxide layer, performing the acid treatment of the surface and analyzing the surface by SIMS. When both results are compared, the distribution of elements in a portion deeper than about 4 nm is substantially same between them, but their difference is clear in a portion ranging from the surface to a depth of about 2 nm, and especially the acid-treated case has a lower concentration of copper in a portion ranging from about 0 to 0.5 nm. Therefore, it is considered that a bonding strength can be improved by controlling the concentration of copper to a lower level in the above range (a depth of about 0 to 0.5 nm).

Figure 11C:
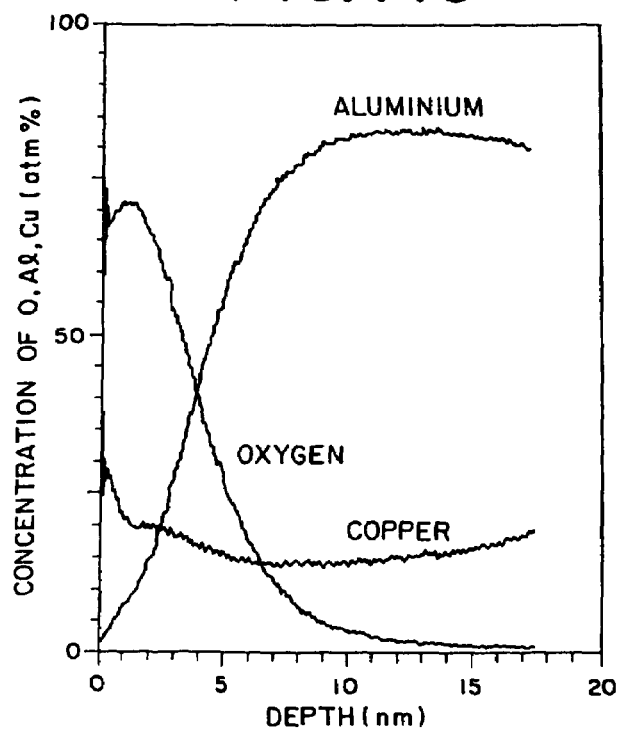

Accordingly, for verification of the above consideration, a pad electrode layer including a surface oxide layer was produced as a comparative example with the processing conditions intentionally changed so that a concentration of copper was a high level of about 20 atm % in a portion from the surface to a depth of about 4 nm (an example of the result by SIMS is shown in FIG. 11c). Its bonding strength was checked but bonding connection could not be made.

It is apparent from the result that when the copper concentration in and just below the surface (a depth of about 0 to 4 nm) of the pad electrode layer containing the surface oxide layer is less than about 20 atm %, bonding becomes possible, and the bonding strength increases as the copper concentration is reduced at a depth of about 0 to 0.5 nm. Practically, the copper concentration in a portion ranging from the surface to a depth of 2 nm is controlled to 10 atm % or less on average, and it can be determined as a standard.

The cause of a change in bonding strength depending on a copper concentration is considered. It is significant that bonding is performed by connecting clean Cu and wire (e.g., Au) penetrating through the surface oxide layer which is mainly consisting of Al, but when the Cu concentration in and just below the surface is high, Cu which is present in the form of an oxide adheres as the Cu oxide to the Au wire surface when bonding. And, the existence of the Cu oxide to the Au wire surface inhibits the bonding with the clean Cu.

The surface acid treatment which is performed to reduce the copper concentration after forming the pad electrode layer including the surface oxide layer may be performed using hydrochloric acid, acetic acid or the like other than a carbonic acid treatment. The copper concentration is lowered by such an acid treatment, because the copper oxide is dissolved preferentially by such an acid.

Seventh Embodiment

Figure 12:
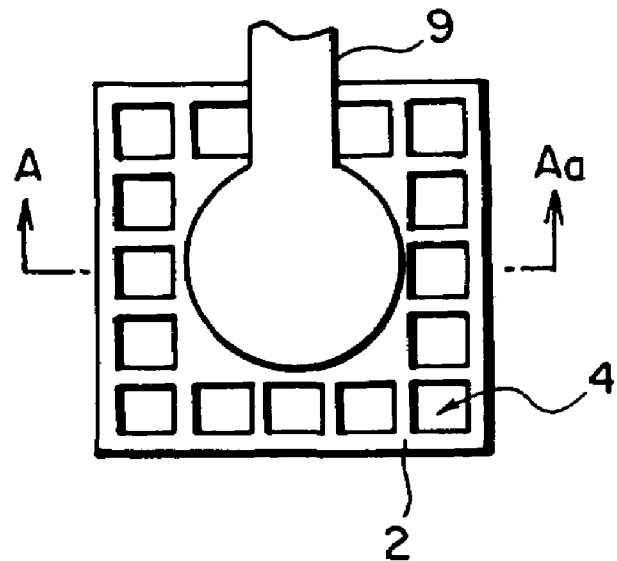
FIG. 12 is a top view showing a structure of a wiring pad for Cu multilayer wiring according to a seventh embodiment of the invention.
Figure 13:
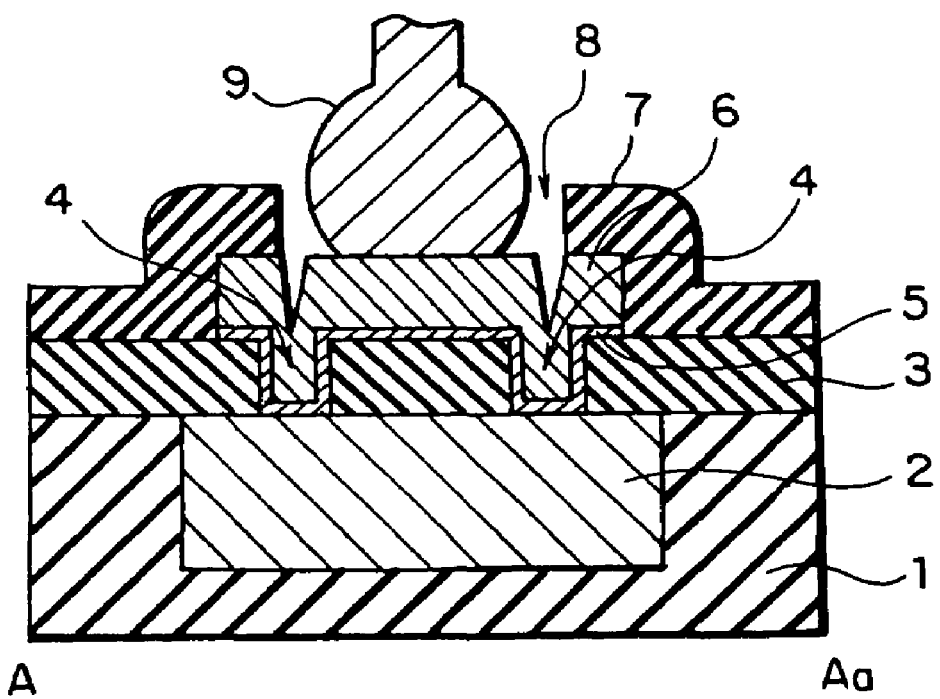
FIG. 13 is a sectional diagram taken along line A-Aa of FIG. 12.

FIG. 12 is a top view showing a structure of a wiring pad for Cu multilayer wiring according to the seventh embodiment of the invention. FIG. 13 is a sectional diagram taken along line A-Aa of FIG. 12.

The manufacturing process of this embodiment will be described. First, an interlayer insulating film 1 is deposited on an unshown Si substrate. An active element and the like are formed integrationally on the surface of the Si substrate, Cu multilayer wiring is formed thereon, and the interlayer insulating film 1 is deposited on the Cu multilayer wiring layer.

Then, a Cu pad 2 is embedded in the surface of the interlayer insulating film 1, and a d (dual phase plasma)-TEOS film 3 is formed on the interlayer insulating film 1 and the Cu pad 2. The d-TEOS film 3 has a thickness of 400 nm, for example.

Then, contact holes 4 having a diameter of 2 μm are formed with a pitch 4 μm in the d-TEOS film 3 on the periphery of the Cu pad 2 by an RIE (Reactive Ion Etching) process. Here, 16 contact holes 4 are formed. Additionally, sidewalls of the contact holes 4 were tapered at 80 degrees by controlling an etching gas.

Then, the surface was cleaned, and a barrier metal film 5 was deposited to cover the inside surfaces of the contact holes 4 by sputtering. Subsequently, an Al cap film 6 (conducting protective layer) is entirely deposited to fill the contact holes 4. The Al cap film 6 may be a pure Al film or an Al film (Al alloy film) containing a small amount of Cu (e.g., 0.5 wt %).

Coverage and adhesion of the barrier metal film 5 and the Al cap film 6 are good because the contact holes 4 are tapered. From the viewpoint of the embedding characteristic of the barrier metal film 5 and the Al cap film 6, it is preferable that the contact holes 4 have an aspect ratio of 0.5 or less.

The barrier metal film 5 is desired to be a TaN/Ta multilayer film (TaN is a lower layer, Ta is an upper layer, and hereinafter the lower layer is indicated before "/" and the upper layer after "/" unless otherwise specified) or a Ta/TiN multilayer film, but any type may be used if it can prevent a reaction between Cu and Al. A liner film (not shown) may be disposed on the barrier metal film 5 in order to improve an embedding property of the conducting protective layer, which is represented by the Al cap film 6, into the contact holes 4. For example, an Nb film, a Ta film, an NbN film, a TaN film and the like are preferably used for the liner film of the Al cap film 6. It is because they have a barrier metal characteristic.

A temperature for forming the Al cap film 6 is preferably a high temperature of 200° C. or more. It is because the fluidity of the Al cap film 6 is improved, and the contact holes 4 are readily filled with the Al cap film 6.

The Al cap film 6 may be formed by various film forming methods, but a film forming method having particularly good step coverage is desirable. For example, long throw sputtering, bias sputtering, ion acceleration sputtering, high-temperature reflow sputtering, combined sputtering thereof, or CVD is desirable.

Thus, there is obtained a structure that the Cu pad 2 has its periphery electrically connected to the Al cap film 6 via the plurality of contact holes 4. There is the d-TEOS film 3 between the Al cap film 6 on the area other than the contact holes and the Cu pad 2.

It is preferable that the contact holes 4 are disposed along the periphery of the Cu pad 2 as in this embodiment. It is because a mechanical action on the contact portion in the probing step, the bonding step or the like can be reduced by arranging as described above, and the Al cap film 6 on the contact holes 4 can be prevented from mechanical bondage (delamination), and the Cu pad 2 can be effectively prevented from being exposed.

Then, the Al cap film 6 and the barrier metal film 5 are processed into a predetermined shape by photolithography and RIE, then a passivation film 7 is entirely deposited and etched to form a pad opening 8.

The pad opening 8 is desirably formed to cover at least a part, preferably the whole of the Al cap film 6 on the contact holes 4 with the passivation film 7 as shown in FIG. 13.

Thus, the Al cap film 6 on the contact holes 5 can be prevented from being broken by the contact of the probing needle in the probing step, and the Cu pad 2 below the contact holes 4 can be prevented from being exposed to the atmosphere.

Here, a density of current passing through the Al cap film 6 after the aforementioned RIE processing is designed to be an allowable current density (a current density with which no failure is caused by EM for a predetermined period, e.g., 10 years). In other words, the diameter of the contact holes and the number of contact holes are determined in such way that the current density becomes an allowable current density or below.

To evaluate reliability, probing test was performed on the wiring pad structure obtained as described above several times, and then a bonding wire 9 was formed on the Al cap film 6. In this state, a protracted test was performed in an oven at 175° C. for 1,000 hours, and the operation of the device was tested. The aforementioned probing was of a wafer level. Additionally, the Al cap film 6 on the contact holes 4 was not covered with the passivation film 7 at all.

Figure 25:
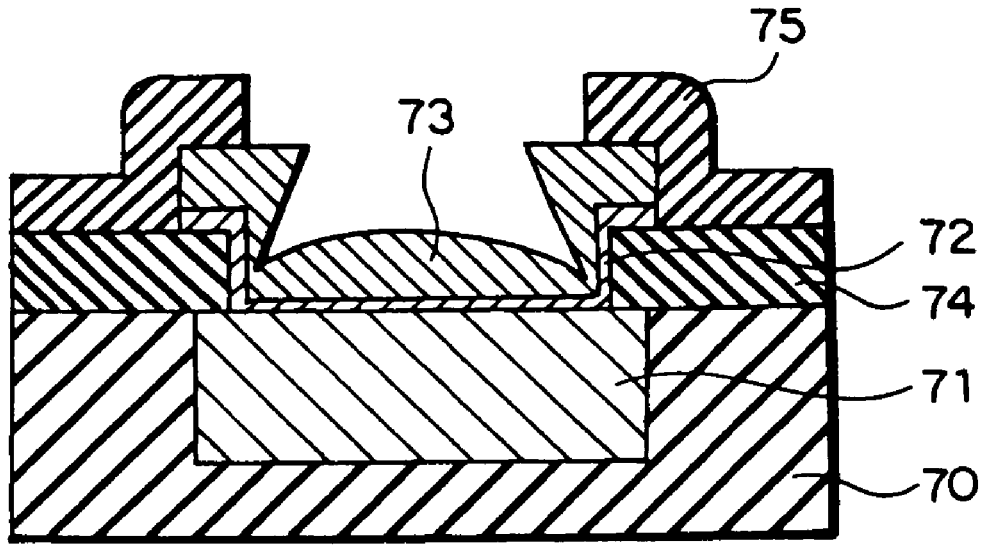
FIG. 25 is a sectional diagram showing an existing structure of a wiring pad for Cu multilayer wiring.
Figure 26:
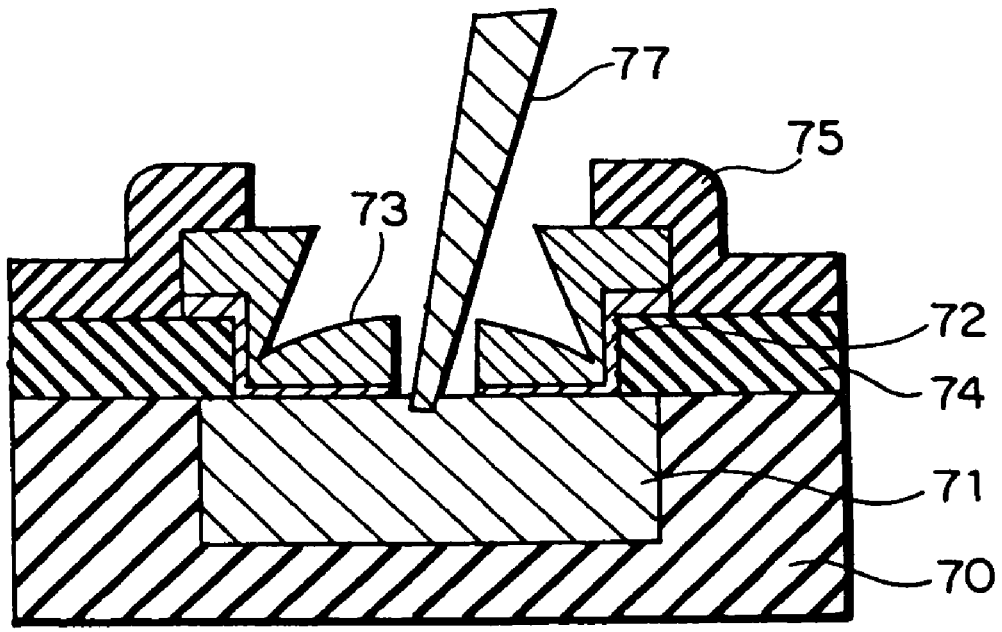
FIG. 26 is a sectional diagram illustrating a disadvantage of an existing structure of a wiring pad for Cu multilayer wiring.

As a result, the yield by the probing test conducted 10 times was 100% according to this embodiment, while the prior wiring pad structure as shown in FIG. 25 had a sample yield of 80% by the probing test conducted two times, a yield of 50% by the probing test conducted 3 times, and a yield of 0% by the probing test conducted six times.

In this embodiment, a reason why the above test results were obtained is considered that even when the Al cap film 6 is broken at a portion where the probing needle is contacted, the surface of the Cu pad 2 was not exposed to the atmosphere because of the presence of the d-TEOS film 3 below it. In other words, a mechanical strength of the Cu pad 2 to the probing needle contact was enhanced, and the Cu pad 2 could be prevented from being oxidized or broken. Therefore, the semiconductor device, in which the Al cap film 6 disposed on the Cu pad 2 can prevent the reliability from being degraded due to the breakage in the probing step, can be realized.

Then, in order to test the diameter dependency of the contact holes 4, contact holes 4 having a diameter of 0.2 to 20 μm were formed. After conducting the same acceleration test, various types of electrical tests were performed. As a result, when the contact holes 4 having a diameter of 0.2 μm or more to less than 0.5 μm, they did not meet the guarantee time by the EM test. As a result of the analysis, the EM breakage was observed at the upper part of the contact holes 4.

Meanwhile, when the contact holes had a diameter of more than 10 μm, the initial yield was decreased to 90% or less. As a result of the analysis, it was found that the initial yield was dropped because the surface of the Cu pad 2 was exposed to the atmosphere and oxidized due to the delamination caused by the contact of the probing needle to the Al cap film 6 in the contact holes 4.

It was found from the above result that the contact holes 4 were desired to have a diameter of 0.5 μm or more to 10 μm or less. For the pitch of the contact holes 4, there was not any obstacle in decreasing the space, and the wiring pad exhibited good electric characteristics (desirable conductivity or non-conductivity) in the above diameter range.

It was found by observing a cross section of the sample which had a good test result that there was no breakage or crack in the d-TEOS film 3 or a defect in the Cu pad 2. The above results were obtained with the contact holes 4 arranged in one row along the periphery of the pad and the same results were also obtained when they were arranged in two rows or more.

Figure 14:
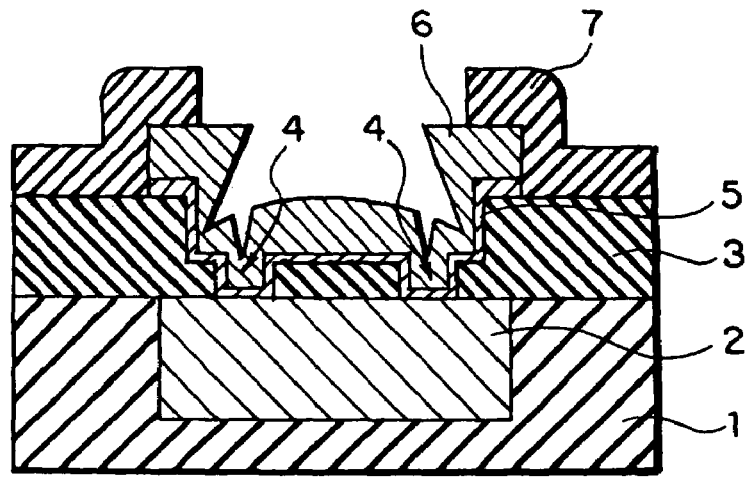
FIG. 14 is a sectional diagram showing a modified example of the seventh embodiment.

FIG. 14 shows a modification of this embodiment. Specifically, the wiring pad has a structure that an aspect ratio of the contact holes 4 can be made small even when the d-TEOS film 3 has a large thickness.

By processing like dual damascene wiring (DD wiring), the contact holes 4 (connection holes where a plug is buried for the DD wiring) are disposed in the groove (wiring groove of the DD wiring) on the surface of the d-TEOS film 3, so that the contact holes 4 can have a small depth, and the aspect ratio can be made small.

Eighth Embodiment

Figure 15:
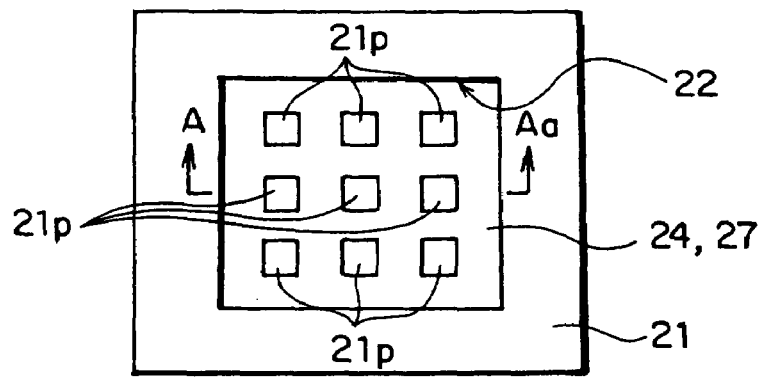
FIG. 15 is a top view showing a structure of a wiring pad for Cu multilayer wiring according to an eighth embodiment of the invention.
Figure 16:
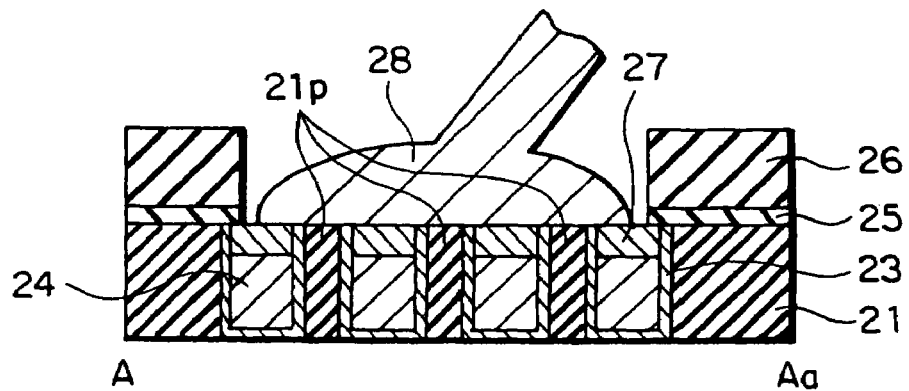
FIG. 16 is a sectional diagram taken along line A-Aa of FIG. 15.

FIG. 15 is a top view showing a structure of the wiring pad for Cu multilayer wiring according to an eighth embodiment of the invention. FIG. 16 is a sectional diagram taken along line A-Aa of FIG. 15.

This embodiment will be described according to the manufacturing process. First, a d-TEOS film 21 is deposited on an unshown Si substrate. An active element and the like are formed integrationally on the surface of the Si substrate, Cu multilayer wiring is formed thereon, and the d-TEOS film 21 is deposited on the Cu multilayer wiring layer.

Then, the d-TEOS film 21 is processed by using the photolithography and RIE to form a pad groove 22 in which a Cu pad is embedded, and d-TEOS pillars 21p (insulating pillars) formed of the d-TEOS film 21 are formed. The d-TEOS pillars 21p have a pitch of 4 μm and a diameter of 2 μm.

Then, a Ta-based barrier metal film 23 and a Cu thin film (not shown) are formed sequentially by the anisotropic sputtering method in which a bias is applied to the Si substrate. Then, a Cu film 24 is entirely deposited to fill the pad groove 22 by an electrolytic plating method using the Cu thin film as a seed.

Then, the unnecessary Cu film 24 and the barrier metal film 23 outside the pad opening 22 are removed by the CMP method to obtain the Cu pad 24 having a predetermined shape.

Then, an etching stopper film 25 and a passivation film 26 are sequentially deposited. Here, a silicon nitride film (p-SiN film) or a silicon carbide film (p-SiC film) formed by the plasma CVD was used as the etching stopper film 25, and a multilayer film of d-TEOS film/p-SiN film was used as the passivation film 26.

Then, the passivation film 26 is etched to reveal the etching stopper film 25 using as a mask a resist having a pattern corresponding to an unshown pad opening, and the revealed etching stopper film 25 is removed by an RIE process using a fluorine-based gas. As a result, an opening to reveal the d-TEOS pillars 21p, the barrier metal film 23 and the Cu pad 24 is formed in the etching stopper film 25 and the passivation film 26.

Then, the surface of the Cu film 24 which was fluoridized by the RIE processing was oxidized by an $O_2$ asher to substitute fluorine of the surface of the Cu film 24 by oxygen, and the deposit left at the RIE process is removed by wet processing.

Then, the hydrogen reduction is performed in the spatter equipment to clean the surface of the Cu film 24, and an Al film (not shown) having a thickness of 10 nm is formed by a sputtering method.

Then, the thermal treatment is performed at 400° C. for 30 minutes to react the Al film with the Cu pad 24 so to form a Cu—Al alloy layer 27 (conducting protective layer) on the upper surface of the Cu pad 24. Then, an excess Al film is removed by wet etching. A cross section was measured after the thermal treatment to find that the Cu—Al alloy layer 27 was formed to a thickness of about 200 nm. It is considered that the oxide present on the surface of Cu was partly remained without being removed thoroughly by the aforementioned treatment because of the d-TEOS pillars 21p, and the diffusion of Al was suppressed to limit its entry to about 200 nm.

It is preferable that the Al component ratio of the Cu—Al alloy layer 27 is 2 wt % to 50 wt % or less, and desirably 10 wt % or more to 50 wt % or less. Its reasons are as follows. That is, when the Al component ratio is less than 2 wt %, Cu becomes rich in amount, and the oxidation preventive function of the Cu—Al alloy layer 27 becomes inadequate. Meanwhile, when the Al component ratio exceeds 50 wt %, the diffusion of Al into the Cu pad 24 might be caused.

The Cu—Al alloy layer 27 may be formed by charging Al ions into the surface of the Cu pad 24 and then annealing. Otherwise, the upper portion of the Cu pad 24 may be removed by etching, and the Cu—Al alloy layer 27 may be formed thereon.

To evaluate reliability, a sample prepared as described above was probe-tested for several times, and then a bonding wire 28 was formed on the Cu—Al alloy layer 27, as in the seventh embodiment. Then, its protracted test was performed in an oven at 175° C. for 1,000 hours to test the operation of the device. As a result, there was obtained a good result with a yield of 100% by ten times of the probing test as in the seventh embodiment.

The above result was obtained with the d-TEOS pillars 21p with a pitch of 4 μm and a diameter of 2 μm disposed. When the same evaluation was performed with the d-TEOS pillars 21p having a different pitch and diameter, it was found that a yield after the acceleration test depended upon the pitch and the diameter. Specifically, it was found that a yield of 100% was obtained when a distance between the adjacent d-TEOS pillars 21p is 0.5 μm or more to 10 μm or less which is determined depending on the pitch and diameter of the d-TEOS pillars 21p because of the same reason as in the seventh embodiment.

Figure 17A:
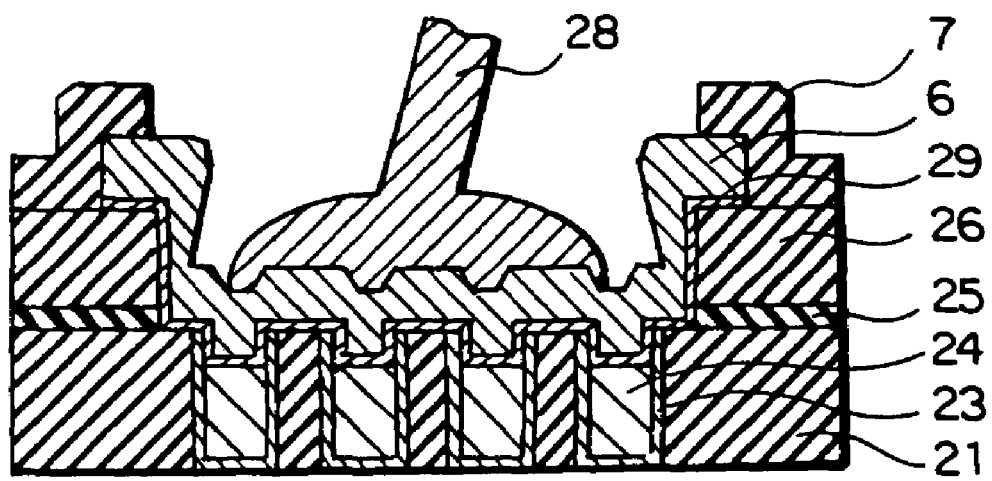
FIG. 17A and FIG. 17B are sectional diagrams illustrating a modified example of the eighth embodiment.

Additionally, when the Al cap film 6 was formed on the Cu—Al alloy layer 27 in the same way as in the seventh embodiment, the same good result as the pad structure of FIG. 16 was obtained. Besides, when a barrier metal film 29 was formed instead of the Cu—Al alloy layer and the Al cap film 6 was formed on the barrier metal film 29 as shown in FIG. 17A, the same good result as the pad structure of FIG. 16 was obtained.

Figure 17B:
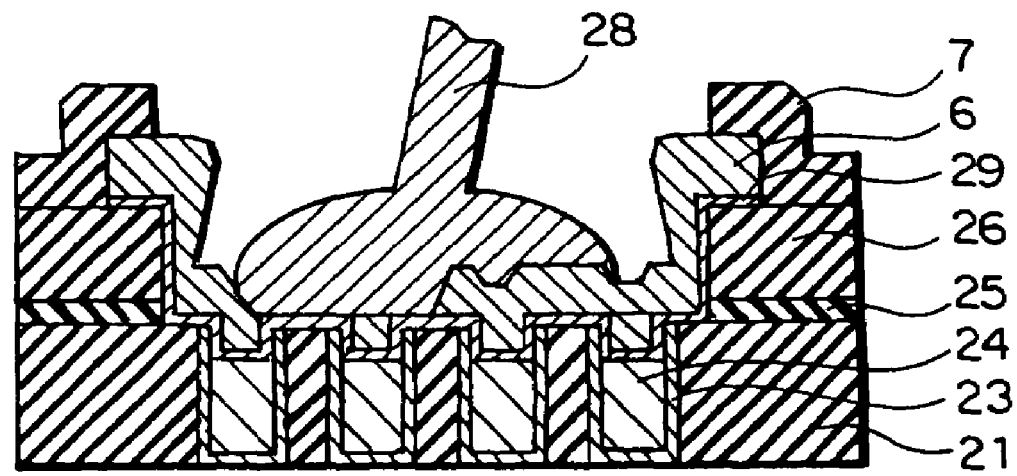

Reasons of such results include that a damage to the Cu pad 24 by the contact of the probing needle can be eased by the d-TEOS pillars 21p. Here, it is significant that the interface between the Cu pad 24 and the Cu—Al alloy layer 27 or the Al cap film 6 is positioned below the upper surface of the d-TEOS pillars 21p. Thus, even if the conducting protective layer (Cu—Al alloy layer 27, the Al cap film 6) is partly broken by the contacted probing needle at the probing process, the Al cap film 6 is remained on the Cu pad 24 as shown in FIG. 17B, for example, and the conducting protective layer can fully perform its function.

Here, as to the method of forming the pad structure shown in FIG. 17A, its differences from the method of forming the pad structure shown in FIG. 16 will be described briefly.

First, the d-TEOS pillars 21p and the pad groove 22 are formed, and the barrier metal film 23 and the Cu pad 24 are formed in the pad groove 22. The Cu pad 24 is formed to fill the pad groove 22.

Then, the surface layer of the Cu pad 24 is lightly etched with a mixed solution of HCl and $H_2O_2$ to make the upper surface of the Cu pad 24 lower (recessed) than the open surface of the opening 22. Here, a recessed amount of the Cu film 24 is desired to be 30 nm or more. Though the recessed amount is desired to be larger, but the upper limit is restricted by an allowance in designing a wiring electric current density.

Then, the etching stopper film 25 and the passivation film 26 are formed, and an opening is formed in the etching stopper film 25 and the passivation film 26 to reveal the d-TEOS pillars 21*p*, the barrier metal film 23 and the Cu pad 24. Then, oxidizing and wetting processes are performed. Such processes are performed by the same way as in the method of forming the pad structure of FIG. 16.

Then, the hydrogen reduction is performed in the spatter equipment to clean the surface layer of the Cu pad 24, and the barrier metal film 29 and the Al cap film 6 are sequentially deposited without breaking the vacuum within the sputter equipment.

Here, the barrier metal film 29 is, for example, a TaN/Ta multilayer film. Preferably, it is a multilayer film which is obtained by forming the TaN/Ta laminated film a plurality of times. Use of such a multilayer film makes it possible to improve the mechanical strength.

From the viewpoint to prevent the decrease in adhesion among the laminated films forming the multilayer film, it is desired to be a multilayer film formed of a laminated film of two layers or more to six layers or less. Additionally, it is desired that each film configuring the multilayer film has a thickness of 5 nm or more in view of the barrier properties after bonding to 30 nm or less in view of adhesion and film forming dust (dust produced when the multilayer film is produced) after bonding.

Then, the barrier metal film 29 and the Al cap film 6 are processed by lithography and RIE to form the passivation film 7.

The seventh and eighth embodiments described above are not limited to the described contents. For example, the main component of the wire was Cu in the above embodiments, but it may be another conductive material such as a Cu alloy, Ag or an Ag alloy. When such conductive materials are used, the Al cap film 6, the Cu—Al alloy layer and the Ag—Al alloy layer can be used as the conducting protective layer in the same way as in the aforementioned embodiments.

Besides, the seventh and eighth embodiments include inventions of various stages, and various inventions can be extracted by appropriately combining the plural disclosed component elements. For example, when the same effect can be obtained regardless of reduction of several component elements from the whole component elements shown in the embodiment, the structure with such component elements removed can be extracted as an invention.

Ninth Embodiment

Figure 18A:
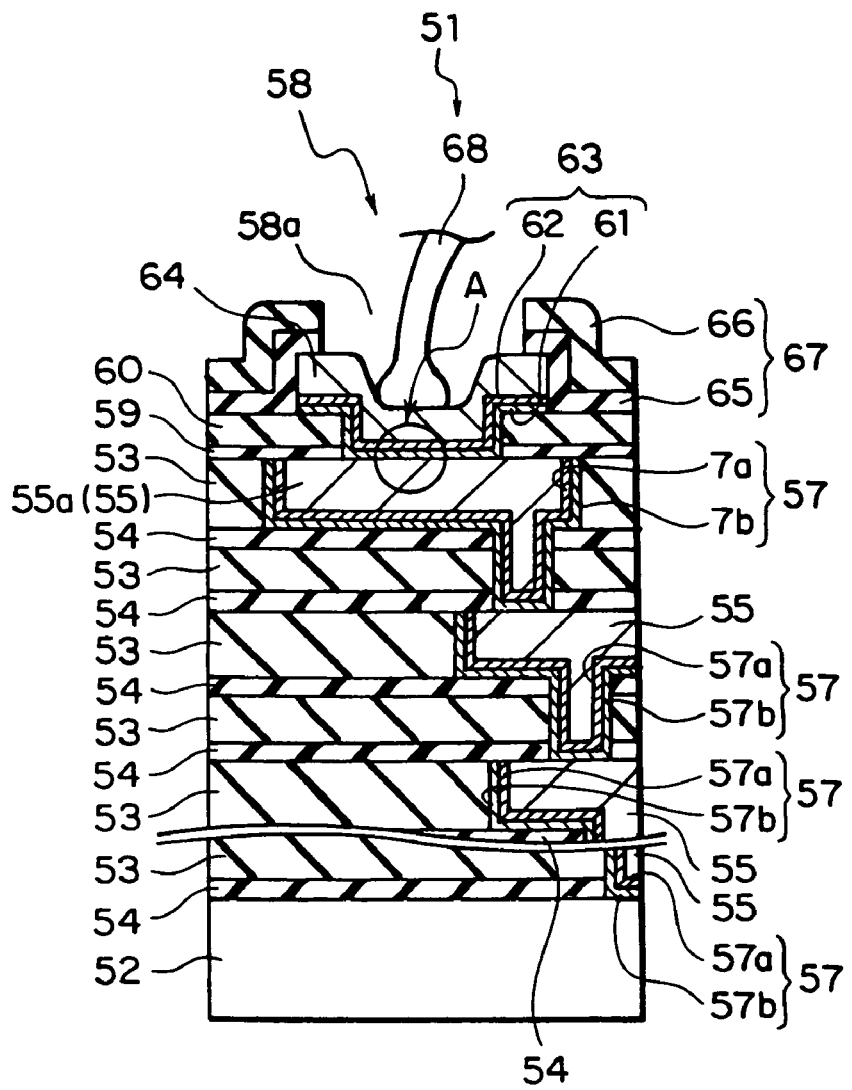
FIG. 18A and FIG. 18B are sectional diagrams showing a structure of a semiconductor device according to a ninth embodiment of the invention.
Figure 18B:
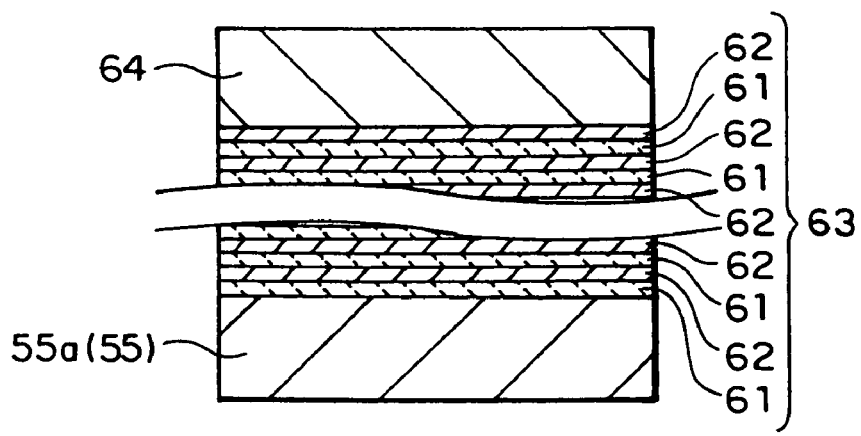

FIG. 18A and FIG. 18B are sectional diagrams showing a structure of a semiconductor device 51 according to the ninth embodiment of the invention, and FIG. 19A to FIG. 19F are sectional diagrams showing its process.

Figure 19A:
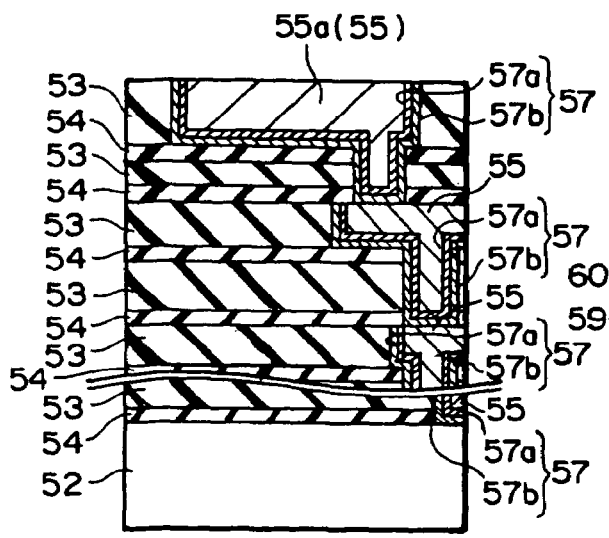
FIG. 19A, FIG. 19B, FIG. 19C, FIG. 19D, FIG. 19E and FIG. 19F are sectional diagrams showing a step of manufacturing the semiconductor device according to the ninth embodiment of the invention.

As shown in FIG. 19A, an interlayer dielectric film (ILD: Inter-level dielectrics) 53 made of a low-k material, a diffusion barrier insulation film 54 and a Cu wire 55 are laminated in multiple layers on an Si substrate 52 to form a multilayer wiring structure. In this embodiment, the Cu wires 55 have a so-called dual damascene structure in which a wiring section and a contact plug section (via section) are integrally formed. A wiring barrier metal film 57 is formed between the Cu wire 55 and the interlayer insulation film 53. This barrier metal film 57 is preferably formed of the same material as a barrier metal film 63 of a pad section to be described later. In this embodiment, the barrier metal film 57 is formed to have a bilayer structure comprising a Ta layer 57*a* and a $Ta_2N$ layer 57*b* which are formed to have a thickness of 15 nm each. Considering chemical compatibility (characteristic) of the materials, an inside layer which is in direct contact with the Cu wire 55 is determined to be the Ta layer 57*a*, and the outside layer of this Ta layer 57*a* is determined to be the $Ta_2N$ layer 57*b*.

Unshown various types of electronic circuits such as active elements are disposed on the substrate 52. The Cu wire 55 is disposed in a predetermined wiring pattern on the substrate 52 to electrically connect such circuits to one another or to electrically connect them to an unshown outside power supply, an outside circuit, or the like.

Figure 19D:
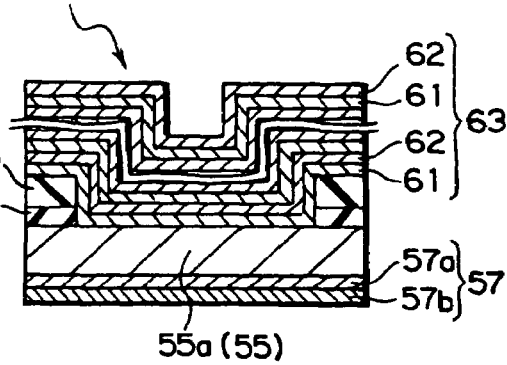
Figure 19B:
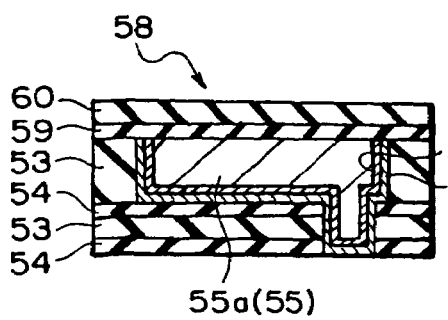

Then, a p-SiN film 59 and a d-TEOS film 60 having a thickness of about 70 nm and about 400 nm respectively are continuously laminated (formed) as a pad section insulating film on the respective Cu wires 55, specifically on the surface of the Cu wiring (pad section Cu wiring) 55*a* on the top layer which partly becomes a wiring pad section 58 of the semiconductor device 51 as shown in FIG. 19B.

Figure 19E:
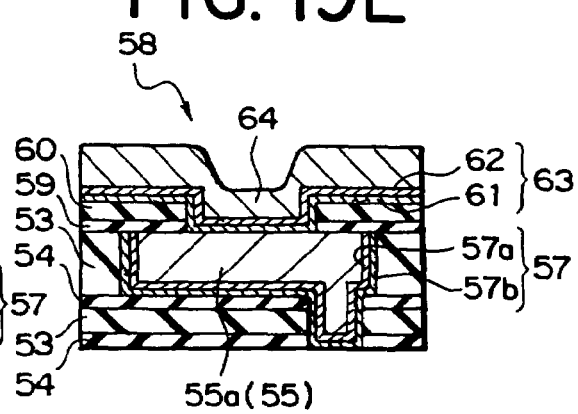
Figure 19C:
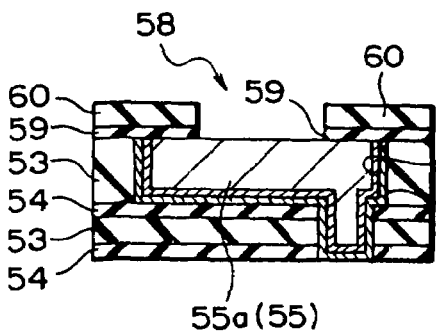

Then, the p-SiN film 59 and the d-TEOS film 60 are etched by the lithography process and the RIE process or the like to open the wiring pad section 58 so that the upper surface of the pad section Cu wire 55*a* is partly revealed as shown in FIG. 19C.

Then, the revealed surface (upper surface) of the pad section Cu wire 55*a* was cleaned, a $Ta_2N$ layer 61 and a Ta layer 62 are alternately stacked in the same layers to form a barrier film (pad section barrier metal film) 63 having a so-called composite multilayer structure by a sputtering step as shown in FIG. 19D. At this time, considering chemical compatibility (characteristic) of the materials, lamination was performed in such a way that the layer which is in direct contact with the pad section Cu wire 55*a* is the $Ta_2N$ layer 61 and the layer which is in direct contact with a protecting conductive layer 64 to be described later is the Ta layer 62. In this embodiment, it is configured that each $Ta_2N$ layer 61 and each Ta layer 62 make a pair, and two (two cycles) pairs or more are laminated. Number of laminated pad section barrier metal films 63 and its thickness can be set to an adequate value within a predetermined range as described later.

The pad section barrier metal film 63 is formed of $Ta_2N$ and Ta in the same way as the wiring barrier metal film 57, so that there is obtained an effect to suppress the diffusion of Cu into the ILD film 53, which is an original function of the top barrier metal film. The film-creating device can be used commonly and the film-forming process can be unified for simplification, so that capital investment is reduced, and the manufacturing cost of the semiconductor device 51 can be reduced. Even when the wiring barrier metal film 57 which includes the lower layer Cu wiring barrier metal film and the pad section barrier metal film 63 which is the upper layer Cu/Al barrier metal film are contacted, there is substantially no possibility to cause a reaction, which increases the resistance value of the wiring pad section 58 or degrades the barrier properties. Therefore, there is substantially no possibility of causing a reaction, which degrades the performance of the semiconductor device 51, in the wiring pad section 58.

Subsequently, the Al cap film 64 was formed as the protective conductive layer in a thickness of about 500 nm on the revealed surface (upper surface) of the pad section barrier metal film 63 without exposing it to the atmosphere as shown in FIG. 19E.

Figure 19F:
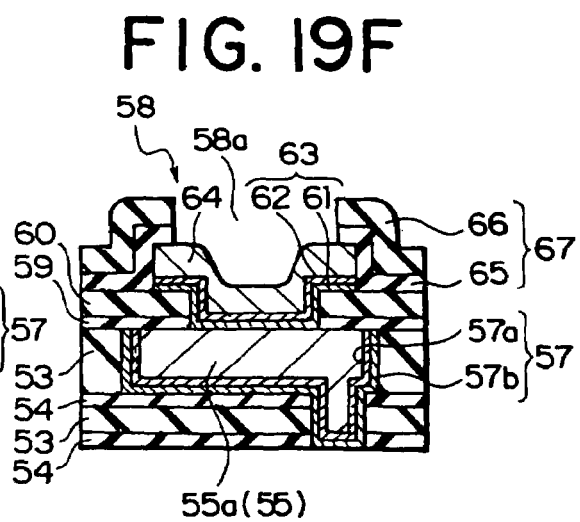

Then, the Al cap film 64 and the pad section barrier metal film 63 are processed by the lithography process and the RIE process to leave the portion which becomes the wiring pad section 58 as shown in FIG. 19F. Subsequently, another d-TEOS film 65 and another p-SiN film 66 are continuously stacked each in a thickness of about 400 nm and about 600 nm on the d-TEOS film 60 to form the passivation film 67. Then, the d-TEOS film 65 and the p-SiN film 66 are etched by the lithography process and the RIE process to partly reveal the upper surface of the Al cap film 64 so to form an opening 58a of the wiring pad section 58.

After that, a predetermined process is performed to obtain the semiconductor device 51 having the pad section barrier metal film 63 with a desired composite multilayer structure. The wiring pad section 58 of the semiconductor device 51 has, for example, an Au bonding wire 68 connected to the revealed surface (upper surface) of the Al cap film 64 which is exposed to the opening 58a as shown in FIG. 18A. Thus, the semiconductor device 51 is electrically connected to an unshown outside power supply, other electronic circuits (electric circuits) and the like. FIG. 18B shows an expanded view of the portion A in the circle of FIG. 18A. Two pairs or more of the $Ta_2N$ layer 61 and the Ta layer 62 whose each layer is formed thin are laminated by the aforesaid step between the pad section Cu wire 55a and the Al cap film 64 to form the pad section barrier metal film 63 having a thin-film compound multilayer structure.

FIG. 18A, FIG. 19E and FIG. 19F show the barrier metal film 13 in a simplified mode by showing the $Ta_2N$ layer 61 and the Ta layer 62 as a single layer so to make them simple and easy to understand.

Then, an experiment conducted by the inventors and its results will be described. The experiment produced samples with the number of laminates (lamination cycle) of the pair of the $Ta_2N$ layer 61 and the Ta layer 62 of the pad section barrier metal film 63 and the thickness of such layers (film thickness) varied to predetermined values, and inspected three items such as the barrier properties, adhesion properties (strength) and generation of dust of the wiring pad section 58 of the respective samples.

Specifically, each sample of the semiconductor devices 51 produced by the aforementioned manufacturing process was heated at about 400° C. for about two hours, and a change in electric resistance of the wiring pad section 58 was measured to check its barrier properties. To evaluate a mechanical strength, the wire pad section 58 was subjected to the probing test many times, and then wire bonding was performed. Besides, a protracted test was performed by an unshown oven (heating device) at about 175° C. for about 1,000 hours, and the device operation test was conducted. An increase rate of resistance of the wire pad section 58 was measured, and the wire bonding section was subjected to a shear test.

FIG. 20 to FIG. 24 to be described later show the above test results as comparative example and first to fourth examples. In FIG. 20 to FIG. 24, symbols O and X of each inspection item are used to indicate the following results. For the Cu/Al barrier properties, O indicates that an increase rate of resistance is less than 10%, and X indicates that an increase rate of resistance is 10% or more. For the post-bonding barrier properties, O indicates that an increase rate of resistance is less than 10%, and X indicates that an increase rate of resistance is 10% or more. For the post-bonding adhesion properties, O indicates that the shear test strength using a 60 μm Au wire is 15 gf or more, and X indicates that the shear test strength is less than 15 gf. For dust, O indicates that there were less than 100 dust particles of 0.2 μm or more in size on one wafer, and X indicates that there were 100 or more dust particles on one wafer.

FIG. 20 shows results of an experiment, a so-called comparative example, obtained by laminating the $Ta_2N$ layer and the Ta layer each having a predetermined thickness according to an existing art in order to compare superiority of the present invention over the existing art.

COMPARATIVE EXAMPLE

As shown in FIG. 20, in the comparison example in which the $Ta_2N$ layer and the Ta layer were laminated as one pair, all of its samples had an excellent result about dust. But, among other items, an excellent result was obtained about the Cu/Al barrier properties only when the $Ta_2N$ layer and the Ta layer were formed in a thickness of about 60 nm and about 10 nm respectively or about 60 nm each.

FIRST EXAMPLE

As shown in FIG. 21, a pair of the $Ta_2N$ layer 61 and the Ta layer 62 was laminated by two cycles with their thickness varied in a range of about 3 nm to 60 nm. According to the first example, when the $Ta_2N$ layer 61 and the Ta layer 62 each were formed to have a thickness of about 3 nm, they had a good dust-free property but their Cu/Al barrier properties, post-bonding barrier properties and post-bonding adhesion properties were not good. When the $Ta_2N$ layer 61 and the Ta layer 62 each were formed to have a thickness of about 60 nm, they had good Cu/Al barrier properties, post-bonding barrier properties and post-bonding adhesion properties but they did not have a good dust-free property.

Thus, according to the first example, when the $Ta_2N$ layer 61 and the Ta layer 62 each were formed with a thickness of about 5 nm to about 30 nm, they had good results in Cu/Al barrier properties, post-bonding barrier properties, post-bonding adhesion properties and dust-free property.

SECOND EXAMPLE

As shown in FIG. 22, a pair of the $Ta_2N$ layer 61 and the Ta layer 62 was laminated by three cycles with their thickness varied in a range of about 3 nm to about 60 nm. The results of the second example were the same as in the first example. Specifically, when the $Ta_2N$ layer 61 and the Ta layer 62 each were formed in a thickness of about 5 nm to about 30 nm, they had good results in Cu/Al barrier properties, post-bonding barrier properties, post-bonding adhesion properties and dust-free property.

THIRD EXAMPLE

As shown in FIG. 23, a pair of the $Ta_2N$ layer 61 and the Ta layer 62 was laminated by six cycles with their thickness varied in a range of about 3 nm to about 60 nm. According to the third example, the results were the same as in the first example when the $Ta_2N$ layer 61 and the Ta layer 62 each were formed in a thickness of about 3 nm. When the $Ta_2N$ layer 61 and the Ta layer 62 each were formed in a thickness of about 60 nm, they had good Cu/Al barrier properties and post-bonding barrier properties, but their post-bonding adhesion properties and dust-free property were not good.

Thus, according to the third example, when the $Ta_2N$ layer 61 and the Ta layer 62 each were formed in a thickness of about 5 nm to about 30 nm, all the items of Cu/Al barrier properties, post-bonding barrier properties, post-bonding adhesion properties and dust-free property were good.

FOURTH EXAMPLE

As shown in FIG. 24, a pair of the $Ta_2N$ layer 61 and the Ta layer 62 was laminated by seven cycles with their thickness varied in a range of about 3 nm to about 60 nm. According to the fourth example, the results were the same as in the first example when the $Ta_2N$ layer 61 and the Ta layer 62 each were formed in a thickness of about 3 nm. Additionally, when the $Ta_2N$ layer 61 and the Ta layer 61 each were formed in a thickness of about 30 nm or 60 nm, the Cu/Al barrier properties and post-bonding barrier properties were good, but the post-bonding adhesion properties and dust-free property were not good.

Thus, when the $Ta_2N$ layer 61 and the Ta layer 62 each were formed in a thickness of about 5 nm or 10 nm in the fourth example, all the items of Cu/Al barrier properties, post-bonding barrier properties, post-bonding adhesion properties and dust-free property were good.

From the results of the comparative example and the first to fourth examples, it was found that the $Ta_2N$ layer 61 and the Ta layer 62 each were desired to have a thickness (single layer thickness) of about 5 nm or more. Additionally, when a pair of the $Ta_2N$ layer 61 and the Ta layer 62 was laminated by two cycles or more, the pad section barrier metal film 63, which had a thin composite multilayer structure having the $Ta_2N$ layer 61 formed in a very small thickness, could have substantially the same diffusion barrier properties as in the comparative example of a single pair structure having the $Ta_2N$ layer formed in a thickness of about 60 nm.

It was also found by the dust measurement and adhesion properties test that the $Ta_2N$ layer 61 and the Ta layer 62 each were desired to have a thickness of about 30 nm or less. It is desired that the $Ta_2N$ layer 61 and the Ta layer 62 each have a thickness of about 30 nm or less from the viewpoint of a fracture toughness value. It was found that a low dust and high-adhesion properties could be realized when the number of laminated pairs of the $Ta_2N$ layer 61 and the Ta layer 62 was six cycles or less. When the number of laminates of the layers 61, 62 is two cycles or more, the barrier properties and mechanical strength are good by virtue of the composite laminate structure, but it is preferable that it is set to six cycles or less from the viewpoint of a resistance value.

It was also found that when the $Ta_2N$ layer 61 and the Ta layer 62 were alternately laminated continuously into a multilayer film, the thin-film formation of the $Ta_2N$ layer 61 which was the main cause of producing dust in the process (sputtering process) to form the layers 61, 62 could be promoted, and dust could be greatly decreased by a pasting effect of the Ta layer 62. Generally, $Ta_2N$ contributes greatly to the diffusion barrier properties, but when a mechanical strength is measured, $Ta_2N$ has a low fracture toughness value and is cracked very easily because it is ceramics. On the other hand, Ta is a single metal and ductile. Therefore, when the pad section barrier metal film 63 was formed as a thin composite multilayer structure comprising the $Ta_2N$ layer 61 and the Ta layer 62 which were formed thin, dust produced in the manufacturing process could be lowered greatly, a mechanical strength was improved greatly, and a yield of packaging reliability could be improved.

Thus, according to this embodiment, the pad section barrier metal film 63 formed in the wiring pad section 58 is formed as a thin composite multilayer structure comprising the $Ta_2N$ layer 61 and the Ta layer 62, so that the barrier properties and strength are improved, and reliability is improved.

The ninth embodiment was described above, but it is to be understood that their structures or steps may be changed partly in various ways or their various settings may be combined without departing from the purpose of the embodiment.

For example, a material for the pad section barrier metal film 63 is not limited to a pair of $Ta_2N$ and Ta, and each pair of TiN and Ti, NbN and Nb, WN and W or ZrN and Zr may be used. Otherwise, each pair may be changed appropriately at every cycle. The layer of a compound is not limited to a nitride but may be carbide based on each element described above or boride. Specifically, according to the respective forming materials of the pad section wire 55a and the cap film 64, a material having the barrier properties to prevent a reaction between the pad section wire 55a and the cap film 64 as the whole pad section barrier metal film 63 may be used selectively from a Group Iva metal, a Group Va metal or a Group Via metal and its compound.

A layer made of a single metal element and a layer of its compound each may be formed to have a different thickness. In this case, when the respective layers are formed to have a thickness of about 5 nm or more to about 30 nm or less, the pad section barrier metal film 63 as the whole can meet the barrier properties, post-bonding barrier properties, post-bonding adhesion properties and dust-free property at the aforementioned levels. The layer made of a compound is desired to have a stoichiometric composition but may have a composition which is slightly different from the former composition. For example, when TaN is used, there is not any problem if N element ratio is in a range of 20 atm % or more to 40 atm % or less. The same is also applied to the wiring barrier metal film 57.

Furthermore, the wire 55 (55a) is not limited to the aforementioned dual damascene structure but may have a single damascene structure. Additionally, the materials for the wire 55 (55a) and the protective conductive layer 64 may be formed of a Cu alloy, an Al alloy or metal elements other than Cu and Al. An adequate material may be used according to a desired performance of a semiconductor device.

It is to be understood that the present invention is not limited to the particular embodiments described with reference to the drawings but all modifications that fall within the accompanying claims can be made without departing from the true spirit and scope of the invention.

What is claimed is:

1. A semiconductor device, comprising:
an insulating film having an opening;
plural insulating pillars disposed in the opening to extend to a level of a top face of the insulating film;
a wiring pad embedded in the opening to extend to midway of the opening, an entirety of the wiring pad being positioned without extending to the level of the top face of the insulating film; and
a conducting protective layer disposed on the wiring pad so as to fill the opening.

2. The semiconductor device according to claim 1, wherein the plural insulating pillars have a length of 0.5 µm or more to 10 µm or less between the adjacent pillars.

3. The semiconductor device according to claim 1, wherein a material for the wiring pad is Cu, and a material for the conducting protective layer is a Cu alloy, Al or an Al alloy.

4. The semiconductor device according to claim 1, wherein a material for the wiring pad is Cu, and a material for the conducting protective layer is an alloy containing copper and a metal having a higher oxidation tendency than copper.

5. The semiconductor device according to claim 4, wherein the metal having the higher oxidation tendency than copper includes at least one selected from aluminum (Al), titanium (Ti), tantalum (Ta), zirconium (Zr), vanadium (V), tin (Sn), tungsten (W), cobalt (Co), iron (Fe), nickel (Ni), ruthenium (Ru), chromium (Cr), molybdenum (Mo), niobium (Nb), hafnium (Hf), magnesium (Mg) and beryllium (Be).

6. The semiconductor device according to claim 4, wherein the material for the conducting protective layer is Cu—Al alloy.

7. The semiconductor device according to claim 6, wherein the Cu—Al alloy has Al component ratio of 2 wt % to 50 wt %.

8. The semiconductor device according to claim 6, further comprising an Al film provided on the conducting protective layer.

9. The semiconductor device according to claim 1, wherein a material for the wiring pad is Cu, and a material for the conducting protective layer is Al or an Al alloy.

10. The semiconductor device according to claim 9, further comprising a barrier metal provided between the wiring pad and the conducting protective layer.

11. The semiconductor device according to claim 1, further comprising a bonding wire connected with the conducting protective layer.

* * * * *